(12) United States Patent
Inaba et al.

(10) Patent No.: US 11,145,775 B2
(45) Date of Patent: Oct. 12, 2021

(54) INTER-CONNECTOR AND SOLAR PANEL

(71) Applicants: KABUSHIKI KAISHA TOYOTA JIDOSHOKKI, Kariya (JP); TOYOTA JIDOSHA KABUSHIKI KAISHA, Toyota (JP)

(72) Inventors: Hirotaka Inaba, Kariya (JP); Motoya Sakabe, Nisshin (JP); Hiroyuki Ohba, Shizuoka-ken (JP)

(73) Assignees: KABUSHIKI KAISHA TOYOTA JIDOSHOKKI, Kariya (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 64 days.

(21) Appl. No.: 16/096,397

(22) PCT Filed: Apr. 26, 2017

(86) PCT No.: PCT/JP2017/016509
§ 371 (c)(1),
(2) Date: Oct. 25, 2018

(87) PCT Pub. No.: WO2017/188305
PCT Pub. Date: Nov. 2, 2017

(65) Prior Publication Data
US 2019/0140123 A1 May 9, 2019

(30) Foreign Application Priority Data
Apr. 28, 2016 (JP) .............................. JP2016-090220

(51) Int. Cl.
*H01L 31/05* (2014.01)
*H01L 31/0224* (2006.01)
*H01L 31/047* (2014.01)

(52) U.S. Cl.
CPC ...... *H01L 31/05* (2013.01); *H01L 31/022425* (2013.01); *H01L 31/047* (2014.12);
(Continued)

(58) Field of Classification Search
CPC ............. H01L 31/0508; H01L 31/0516; H01L 31/022441; H01L 31/022433;
(Continued)

(56) References Cited

U.S. PATENT DOCUMENTS 3,454,774 A * 7/1969 Wizenick ............ H01L 31/0508
136/244
3,466,198 A * 9/1969 Yasui .................. H01L 31/0508
136/244
(Continued)

FOREIGN PATENT DOCUMENTS

DE 10 2006 019 638 A1 11/2007
JP 2005-072115 A 3/2005
(Continued)

OTHER PUBLICATIONS

International Preliminary Report on Patentability with the translation of Written Opinion dated Oct. 30, 2018 issued by the International Bureau in International application No. PCT/JP2017/016509.
(Continued)

*Primary Examiner* — Andrew J Golden
(74) *Attorney, Agent, or Firm* — Sughrue Mion, PLLC

(57) ABSTRACT

This inter-connector is provided with: a first electrode; a second electrode; and a connecting body which connects the first electrode and the second electrode. The connecting body comprises: a first junction portion connected to the first electrode; a first bypass portion connected with respect to the first junction portion; a first reinforcement portion connected to the first junction portion and the first bypass portion; a second junction portion connected to the second
(Continued)

electrode; a second bypass portion connected with respect to the second junction portion; a second reinforcement portion connected to the second junction portion and the second bypass portion; and a connection portion connecting the first bypass portion and the second bypass portion.

7 Claims, 14 Drawing Sheets

(52) U.S. Cl.
CPC .. *H01L 31/0508* (2013.01); *H01L 31/022441* (2013.01); *H01L 31/0516* (2013.01); *Y02E 10/50* (2013.01)

(58) Field of Classification Search
CPC ... H01L 31/0682; H01L 31/05; H01L 31/047; H01L 31/022425
USPC ................................. 136/243–265
See application file for complete search history.

(56) References Cited

U.S. PATENT DOCUMENTS

| | | | | |
|---|---|---|---|---|
| 4,193,820 A | * | 3/1980 | Thomas | H01L 31/0508 136/244 |
| 8,636,198 B1 | * | 1/2014 | Linderman | H01L 31/0508 228/180.21 |
| 2004/0094195 A1 | | 5/2004 | Kuechler | |
| 2005/0268959 A1 | | 12/2005 | Aschenbrenner et al. | |
| 2007/0199592 A1 | | 8/2007 | Agui et al. | |
| 2010/0144218 A1 | * | 6/2010 | Rose | H01L 31/0508 439/883 |
| 2011/0067746 A1 | * | 3/2011 | Okubo | H01L 31/0508 136/244 |
| 2011/0240337 A1 | * | 10/2011 | Montello | H01L 31/0508 174/126.1 |
| 2014/0124014 A1 | | 5/2014 | Morad et al. | |

FOREIGN PATENT DOCUMENTS

| | | |
|---|---|---|
| JP | 2005-191479 A | 7/2005 |
| JP | 2007-227786 A | 9/2007 |
| JP | 2013-008983 A | 1/2013 |
| JP | 2015-534288 A | 11/2015 |

OTHER PUBLICATIONS

International Search Report for PCT/JP2017/016509 dated Jun. 13, 2017 [PCT/ISA/210].

* cited by examiner

INTER-CONNECTOR AND SOLAR PANEL

CROSS REFERENCE TO RELATED APPLICATIONS

This application is a National Stage of International Application No. PCT/JP2017/016509 filed Apr. 26, 2017, claiming priority based on Japanese Patent Application No. 2016-090220 filed Apr. 28, 2016.

TECHNICAL FIELD

The present invention relates to an interconnector and a solar panel.

BACKGROUND ART

A prior art solar panel is disclosed in FIGS. 1 to 3 of patent document 1. The solar panel includes a protection cover, a back cover, a first photovoltaic cell, a second photovoltaic cell, an interconnector, and an encapsulation member.

The protection cover is made from a resin and is transparent from the upper surface to the lower surface. The back cover is also made from a resin. The first photovoltaic cell and the second photovoltaic cell are located adjacent to each other in a first direction. More specifically, the first photovoltaic cell is located at one side in the first direction. The second photovoltaic cell is located at the other side in the first direction.

The interconnector is a ribbon-shaped plate. The interconnector is located between the first photovoltaic cell and the second photovoltaic cell. The interconnector includes a first electrode connected to the first photovoltaic cell, a second electrode connected to the second photovoltaic cell, and a connection body extending in the first direction to connect the first electrode and the second electrode. The connection body is formed by spirally winding a portion of the plate that forms the interconnector. The first photovoltaic cell, the second photovoltaic cell, and the interconnector, which are located between the protection cover and the back cover, are encapsulated and fixed to one another by the encapsulation member.

In the solar panel, the first photovoltaic cell and the second photovoltaic cell, which are adjacent to each other in the first direction, are electrically connected to each other by the interconnector.

This type of solar panel may be expanded and contracted by changes in the temperature that occur when the solar panel is manufactured or used. This changes the interval between the first photovoltaic cell and the second photovoltaic cell, which are adjacent to each other. More specifically, the contraction of the solar panel caused by changes in the temperature narrows the interval between the first photovoltaic cell and the second photovoltaic cell, and the expansion of the solar panel caused by changes in the temperature widens the interval between the first photovoltaic cell and the second photovoltaic cell. Such changes in the interval may break the interconnector in the thickness-wise direction or separate the first electrode from the first photovoltaic cell or the second electrode from the second photovoltaic cell. This may result in defective electrical connections between the first photovoltaic cell and the second photovoltaic cell.

In this regard, in the solar panel disclosed in patent document 1, the connection body deforms to absorb changes in the interval between the first photovoltaic cell and the second photovoltaic cell. Thus, even when the solar panel is expanded and contracted by changes in the temperature, occurrence of defective electrical connections between the first photovoltaic cell and the second photovoltaic cell is limited.

PRIOR ART DOCUMENT

Patent Document

Patent Document 1: Japanese Laid-Open Patent Publication No. 2005-72115

SUMMARY OF THE INVENTION

Problems that are to be Solved by the Invention

In the prior art solar panel described above, the deformation of the connection body generates stress in the connection body. Thus, the interconnector is prone to break, and the solar panel has a low durability.

It is an object of the present invention to provide a solar panel that limits occurrence of defective electrical connections between a first photovoltaic cell and a second photovoltaic cell even when the solar panel is expanded or contracted by changes in the temperature, and that has a high durability.

Means for Solving the Problem

To achieve the above object, an interconnector is configured to electrically connect a first photovoltaic cell and a second photovoltaic cell. The first photovoltaic cell and the second photovoltaic cell are adjacent to each other in a first direction. The first photovoltaic cell is located at a first side in the first direction. The second photovoltaic cell is located at a second side in the first direction. The interconnector includes a first electrode configured to be connected to the first photovoltaic cell, a second electrode configured to be connected to the second photovoltaic cell, and a connection body that connects the first electrode and the second electrode. The connection body includes a first junction connected to the first electrode, a first detour connected to the first junction from a first side in a second direction generally orthogonal to the first direction and extending from the first junction toward the first side in the second direction, a first reinforcement portion connected to the first junction and the first detour and extending from the first junction and the first detour toward the second side in the first direction, a second junction connected to the second electrode, a second detour connected to the second junction from the first side in the second direction and extending from the second junction toward the first side in the second direction, a second reinforcement portion connected to the second junction and the second detour and extending from the second junction and the second detour toward the first side in the first direction, and a joint connecting the first detour and the second detour.

To achieve the above object, a solar panel includes the interconnector described above, the first photovoltaic cell, the second photovoltaic cell, a protection cover including an upper surface and a lower surface, the protection cover being transparent from the upper surface to the lower surface, a back cover that cooperates with the protection cover to cover the first photovoltaic cell, the second photovoltaic cell, and the interconnector located between the protection cover and the back cover, and an encapsulation member. The encapsulation member encapsulates the first photovoltaic cell, the second photovoltaic cell, and the interconnector and fixes the first photovoltaic cell, the second photovoltaic cell, and the interconnector to one another.

EMBODIMENTS OF THE INVENTION

First to fourth embodiments of the present invention will now be described with reference to the drawings.

First Embodiment

Figure 1:
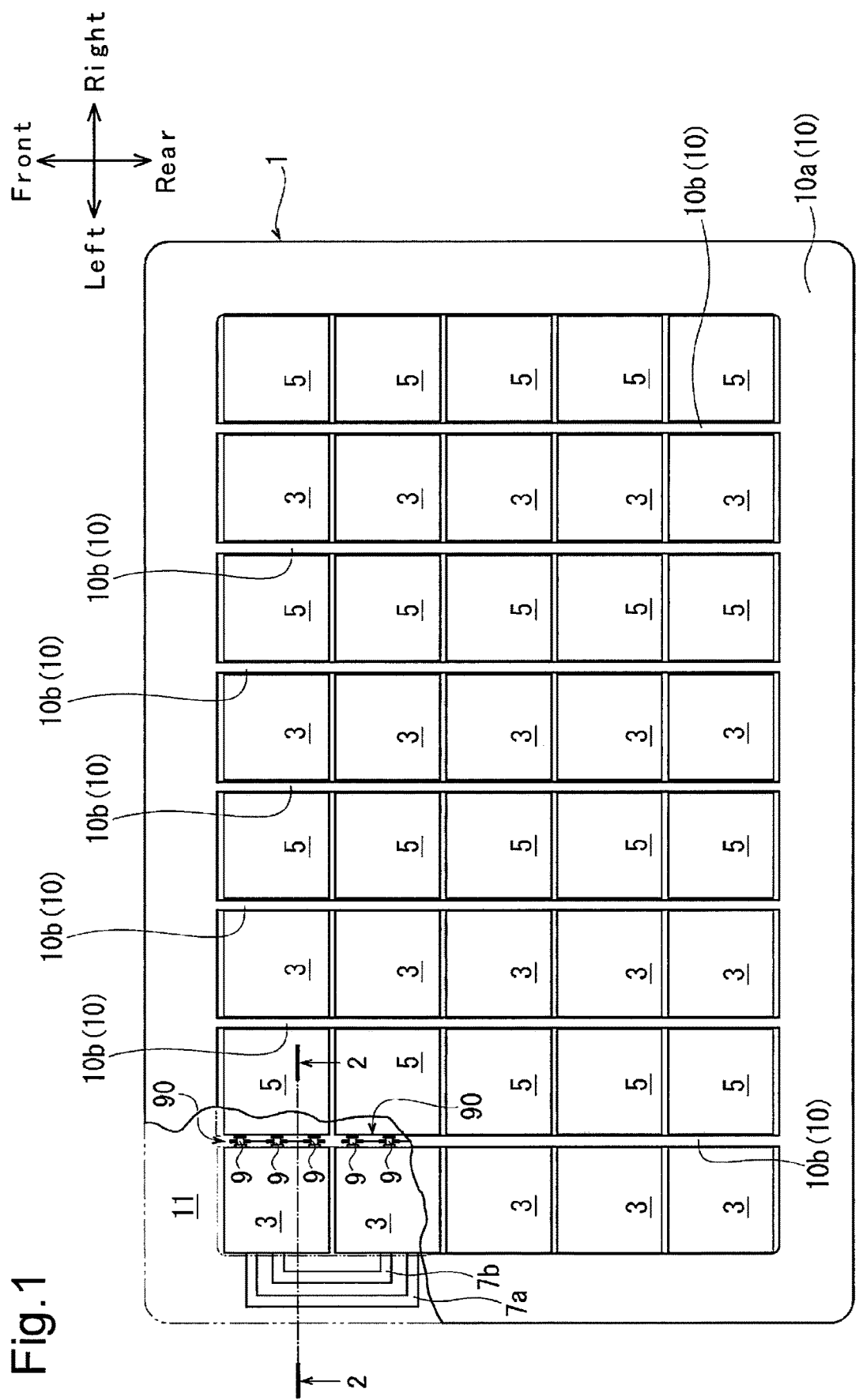
FIG. 1 is a top view showing a first embodiment of a solar panel.
Figure 2:
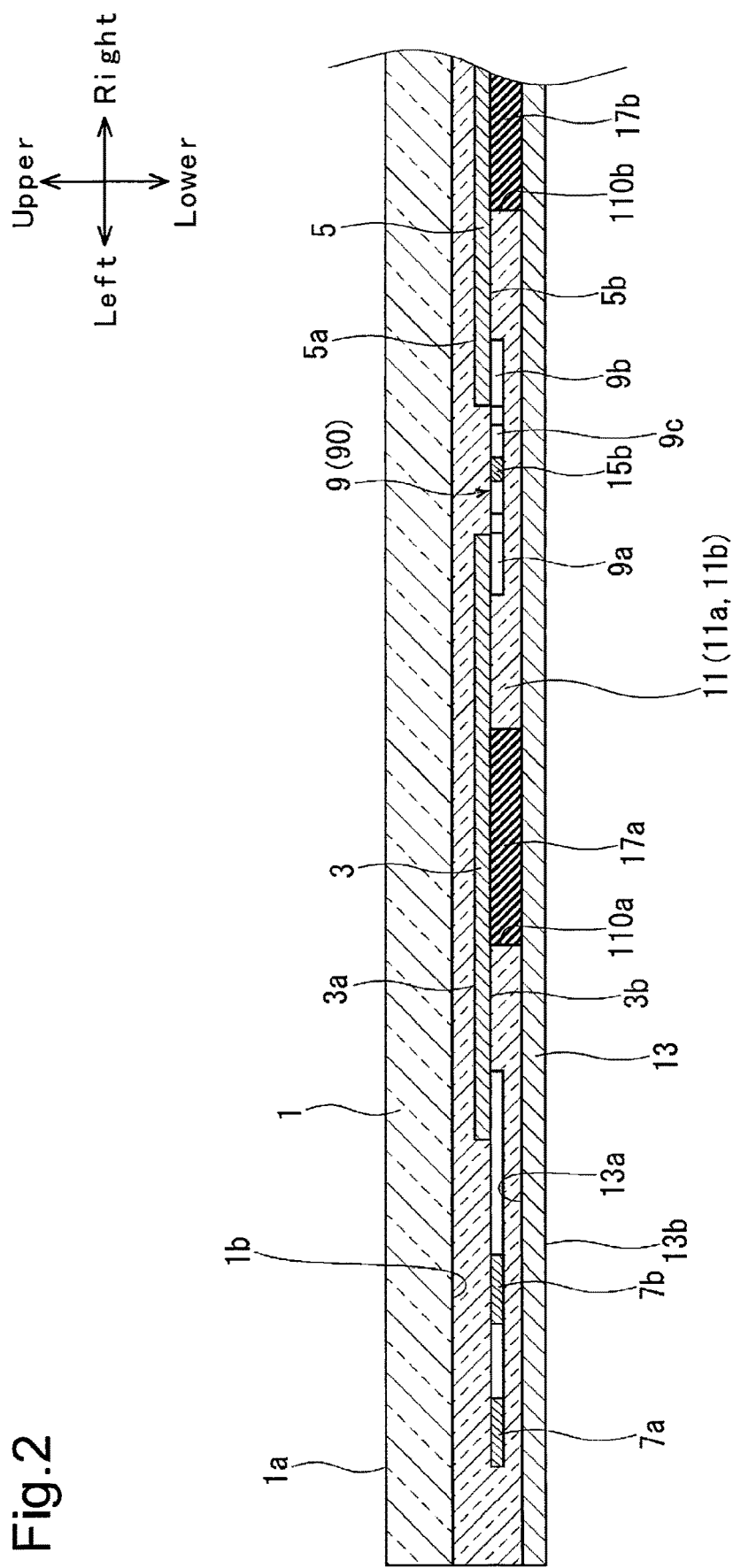
FIG. 2 is an enlarged cross-sectional view taken along line 2-2 in FIG. 1.

As shown in FIG. 1, a first embodiment of a solar panel includes a protection plate 1, a plurality of first photovoltaic cells 3, a plurality of second photovoltaic cells 5, a plurality of tab wires 7a and 7b, a plurality of interconnectors 9, and an encapsulation member 11. As shown in FIG. 2, the solar panel further includes a back panel 13. The protection plate 1 corresponds to a protection cover. The back panel 13 corresponds to a back cover. To simplify the illustration, FIG. 1 does not show a portion of the protection plate 1 indicated by a broken line.

In the present embodiment, the directions indicated by arrows in FIG. 1 define a sideward direction and a front-rear direction of the solar panel. The sideward direction is orthogonal to the front-rear direction. In addition to the directions of the solar panel as defined in FIG. 1, the thickness-wise direction of the solar panel is defined as a vertical direction, for example, referring to FIG. 2. The sideward direction of the solar panel corresponds to a first direction. The left side corresponds to a first side (one side) in the first direction. The right side corresponds to a second side (the other side) in the first direction. The front-rear direction of the solar panel corresponds to a second direction. The rear side corresponds to a first side (one side) in the second direction. The front side corresponds to a second side (the other side) in the second direction. These directions are examples for facilitating understanding and not related to the directions of the solar panel when installed.

Referring to FIG. 2, the protection plate 1, which includes an upper surface 1a and a lower surface 1b, is formed from a resin, the main component of which is polycarbonate, and translucent throughout from the upper surface 1a to the lower surface 1b. The upper surface 1a of the protection plate 1 defines an upper surface of the solar panel, that is, an external surface of the solar panel. The upper surface 1a is flat and level. The lower surface 1b is also flat and parallel to the upper surface 1a. Thus, as shown in FIG. 1, the protection plate 1 is rectangular and flat. Alternatively, the protection plate 1 may be formed from, for example, a different resin or inorganic glass. Additionally, the protection plate 1 may be designed to have an appropriate thickness. The protection cover may be formed, for example, by a translucent protection film instead of the protection plate 1.

As shown in FIG. 1, the protection plate 1 includes a shield 10. The shield 10 includes a body portion 10a, which is configured to shield the tab wires 7a and 7b from the side of the upper surface 1a of the protection plate 1, and a plurality of connection portions 10b. The connection portions 10b are configured to shield the interconnectors 9 and first and second links 15a and 15b, which will be described later, from the side of the upper surface 1a.

The body portion 10a and the connection portions 10b are formed by painting predetermined positions of the lower surface 1b of the protection plate 1 with an opaque color such as black or printing the predetermined positions of the lower surface 1b in an opaque color such as black. More specifically, the body portion 10a is located on a position of the protection plate 1 defining an outer region of a photovoltaic cell group that includes the first photovoltaic cells 3 and the second photovoltaic cells 5. The body portion 10a is frame-shaped to surround the first and second photovoltaic cells 3 and 5. Each of the connection portions 10b is located at an inner side of the body portion 10a and extends in the front-rear direction of the protection plate 1 to be continuous with a front end and rear end of the body portion 10a. The number of the connection portions 10b is set in accordance with the number of intervals between adjacent ones of the first photovoltaic cells 3 and the second photovoltaic cells 5 in the sideward direction. The size of the connection portions 10b is set in correspondence with the size of the interval, namely, an interval W1 (refer to FIG. 3) described later, between the first photovoltaic cell 3 and the second photovoltaic cell 5 that are adjacent to each other in the sideward direction. To simplify the illustration, FIGS. 2 and 6 to 8 do not show the shield 10.

Each of the first photovoltaic cell 3 and the second photovoltaic cell 5, which are shown in FIG. 2, includes crystalline silicon. The first and second photovoltaic cells 3 and 5 have the same structure and the same properties. More specifically, each of the first photovoltaic cells 3 has the form of a thin film and includes an upper surface 3a and a lower surface 3b. Also, each of the second photovoltaic cells 5 has the form of a thin film and includes an upper surface 5a and a lower surface 5b. The lower surfaces 3b of the first photovoltaic cells 3 and the lower surfaces 5b of the second photovoltaic cells 5 each include a conductive portion (not shown). Alternatively, the upper surfaces 3a of the first photovoltaic cells 3 and the upper surfaces 5a of the second photovoltaic cells 5 may each include a conductive portion.

As shown in FIG. 1, the first and second photovoltaic cells 3 and 5 are arranged in a lattice in the front-rear and sideward directions of the solar panel. Additionally, the first photovoltaic cells 3 and the second photovoltaic cells 5 are alternately arranged adjacent to one another in the sideward direction. The size and number of the first and second photovoltaic cells 3 and 5 may be changed in accordance with, for example, the size of the solar panel.

The tab wires 7a and 7b are formed by thin metal plates. The tab wires 7a and 7b are located at the right or left end of the solar panel. The tab wires 7a and 7b are arranged at fixed intervals. The tab wires 7a and 7b may electrically connect the first photovoltaic cells 3 that are located in different rows in the front-rear direction. The tab wires 7a and 7b may electrically connect the second photovoltaic cells 5 that are located in different rows in the front-rear direction. The positions where the tab wires 7a and 7b are connected to the first photovoltaic cells 3 and the positions where the tab wires 7a and 7b are connected to the second photovoltaic cells 5 may be changed in addition to the shape and number of the tab wires 7a and 7b.

Figure 3:
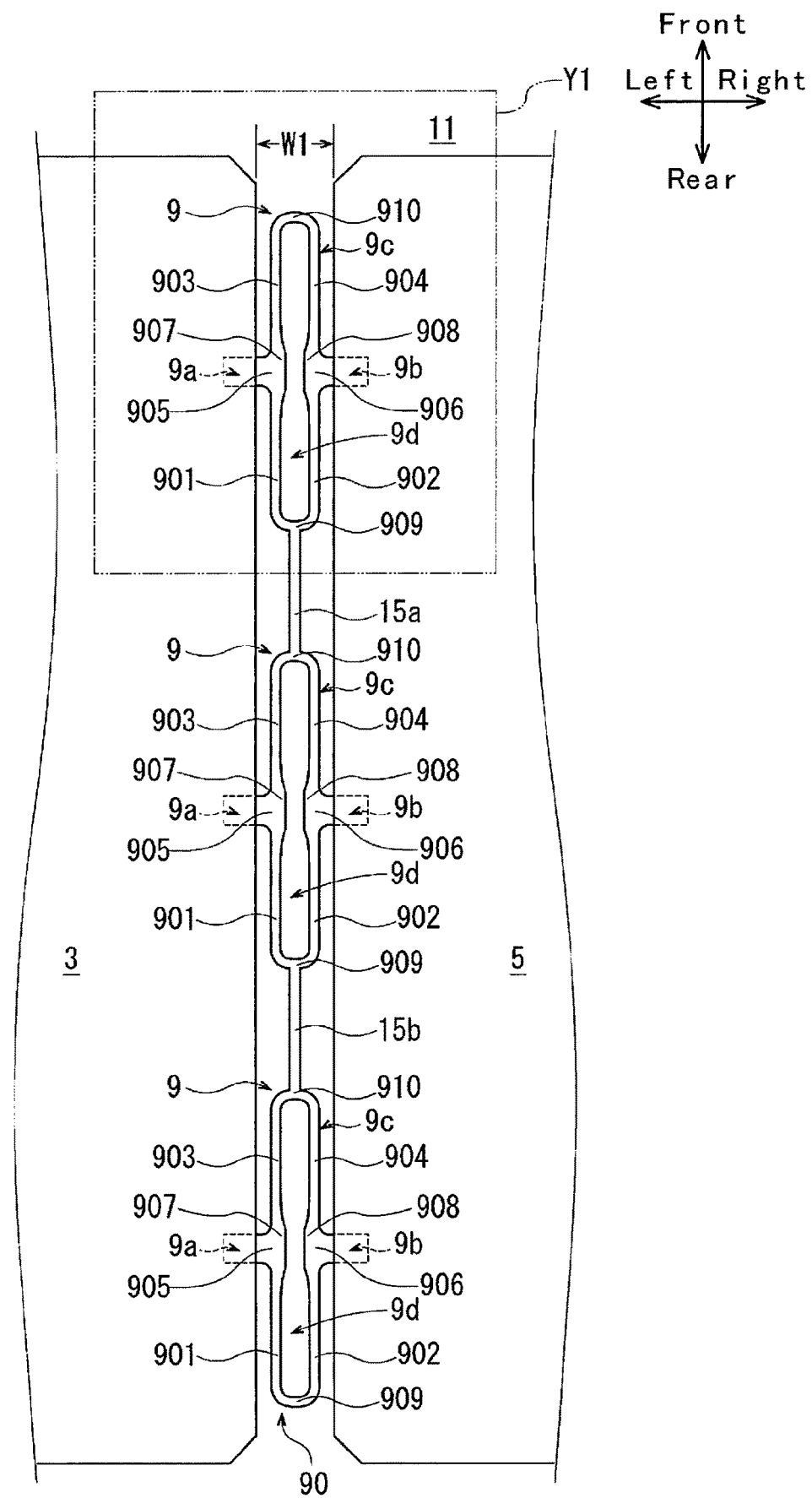
FIG. 3 is an enlarged top view showing a first photovoltaic cell, a second photovoltaic cell, and interconnectors of the solar panel shown in FIG. 1.

As shown in FIG. 3, the three interconnectors 9 have identical shapes and are connected by the first link 15a and the second link 15b to form an interconnector group 90. The interconnector group 90, that is, the three interconnectors 9 and the first and second links 15a, 15b, is integrally formed by stamping a single copper plate. The interconnector group 90 is flat and parallel to the first photovoltaic cells 3 and the second photovoltaic cells 5 (refer to FIG. 2). Alternatively, a metal plate that differs from the copper plate may be used to form the interconnector group 90. The number of the interconnectors 9 forming the interconnector group 90 may be changed to any number that is greater than or equal to two.

Figure 4:
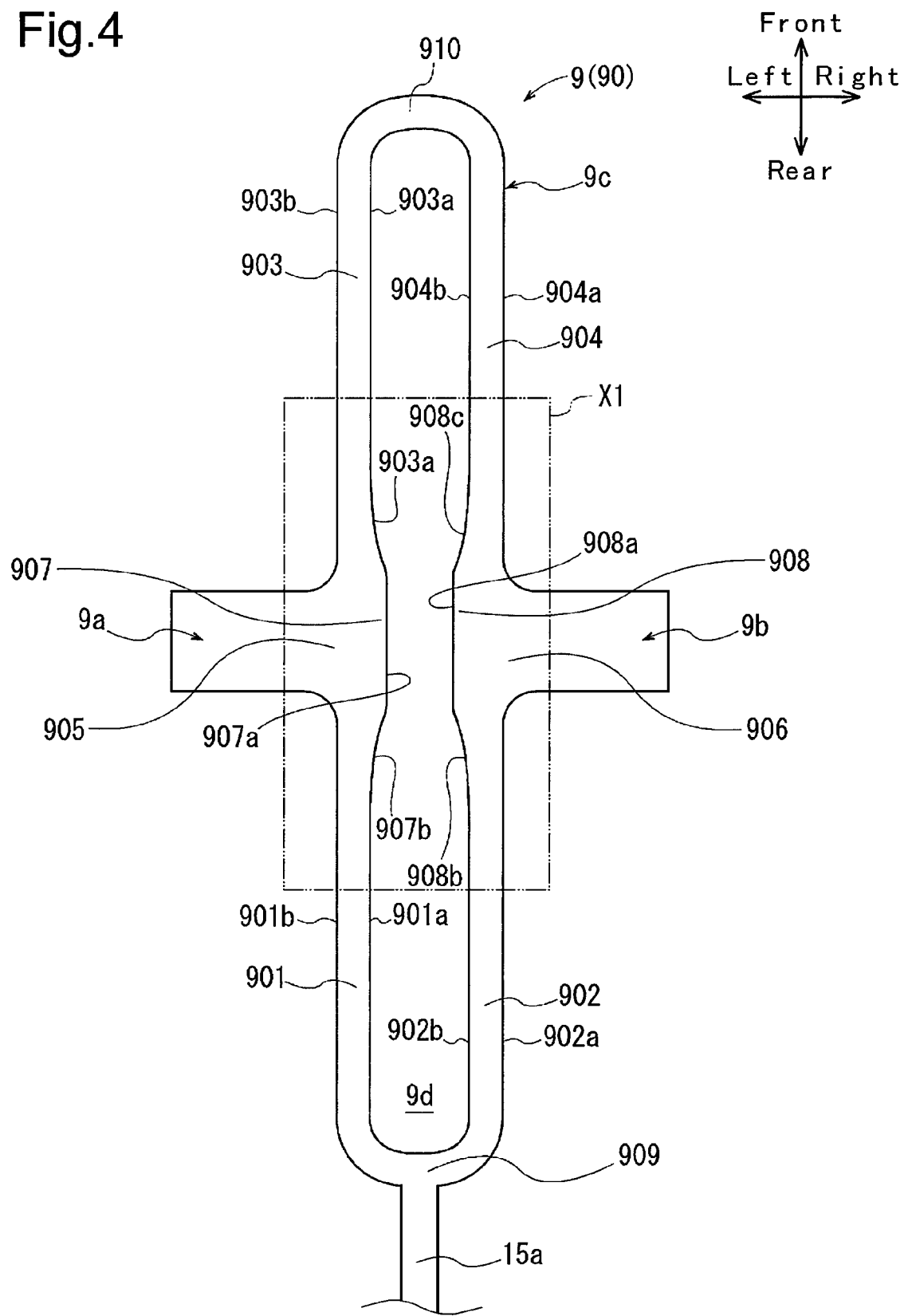
FIG. 4 is an enlarged top view showing one of the interconnectors shown in FIG. 3.

As shown in FIG. 4, the interconnector 9 includes a first electrode 9a, a second electrode 9b, and a connection body 9c. The first electrode 9a is located at the left side of the interconnector 9. The second electrode 9b is located at the right side of the interconnector 9. The first electrode 9a is rectangular and extends leftward. The second electrode 9b is also rectangular and extends rightward.

The connection body 9c has the form of a fine line in a plan view. The connection body 9c includes a rear first detour 901, a rear second detour 902, a front first detour 903, a front second detour 904, a first junction 905, a second junction 906, a first reinforcement portion 907, a second reinforcement portion 908, a first joint 909, and a second joint 910. The rear first detour 901 and the rear second detour 902 are located at one side in the second direction. The front first detour 903 and the front second detour 904 are located at the other side in the second direction. The rear first detour 901 and the front first detour 903 correspond to a first detour. The rear second detour 902 and the front second detour 904 correspond to a second detour.

The rear first detour 901 and the front first detour 903 are located at the left side of the interconnector 9. The rear second detour 902 and the front second detour 904 are located at the right side of the interconnector 9.

The rear first detour 901 and the rear second detour 902 are symmetrical about the left and right sides of the interconnector 9. More specifically, the rear first detour 901 and the rear second detour 902 are symmetrical about an axis of the interconnector 9 extending in the front-rear direction. In the same manner, the front first detour 903 and the front second detour 904 are symmetrical at the left and right sides. The first junction 905 and the second junction 906 are symmetrical at the left and right sides. The first reinforcement portion 907 and the second reinforcement portion 908 are symmetrical at the left and right sides. Hereafter, the configurations of the rear first detour 901, the front first detour 903, the first junction 905, and the first reinforcement portion 907 will be described in detail. The configurations of the rear second detour 902, the front second detour 904, the second junction 906, and the second reinforcement portion 908 will not be described in detail.

The rear first detour 901 linearly extends as a single line away from the first electrode 9a toward the rear of the interconnector 9. The rear first detour 901 includes a right edge 901a and a left edge 901b.

The front first detour 903 and the rear first detour 901 are symmetrical at the front and rear sides. More specifically, the front first detour 903 and the rear first detour 901 are symmetrical about an axis of the interconnector 9 extending in the sideward direction. Hence, the front first detour 903 linearly extends as a single line away from the first electrode 9a toward the front of the interconnector 9. The front first detour 903 includes a right edge 903a and a left edge 903b.

Figure 5:
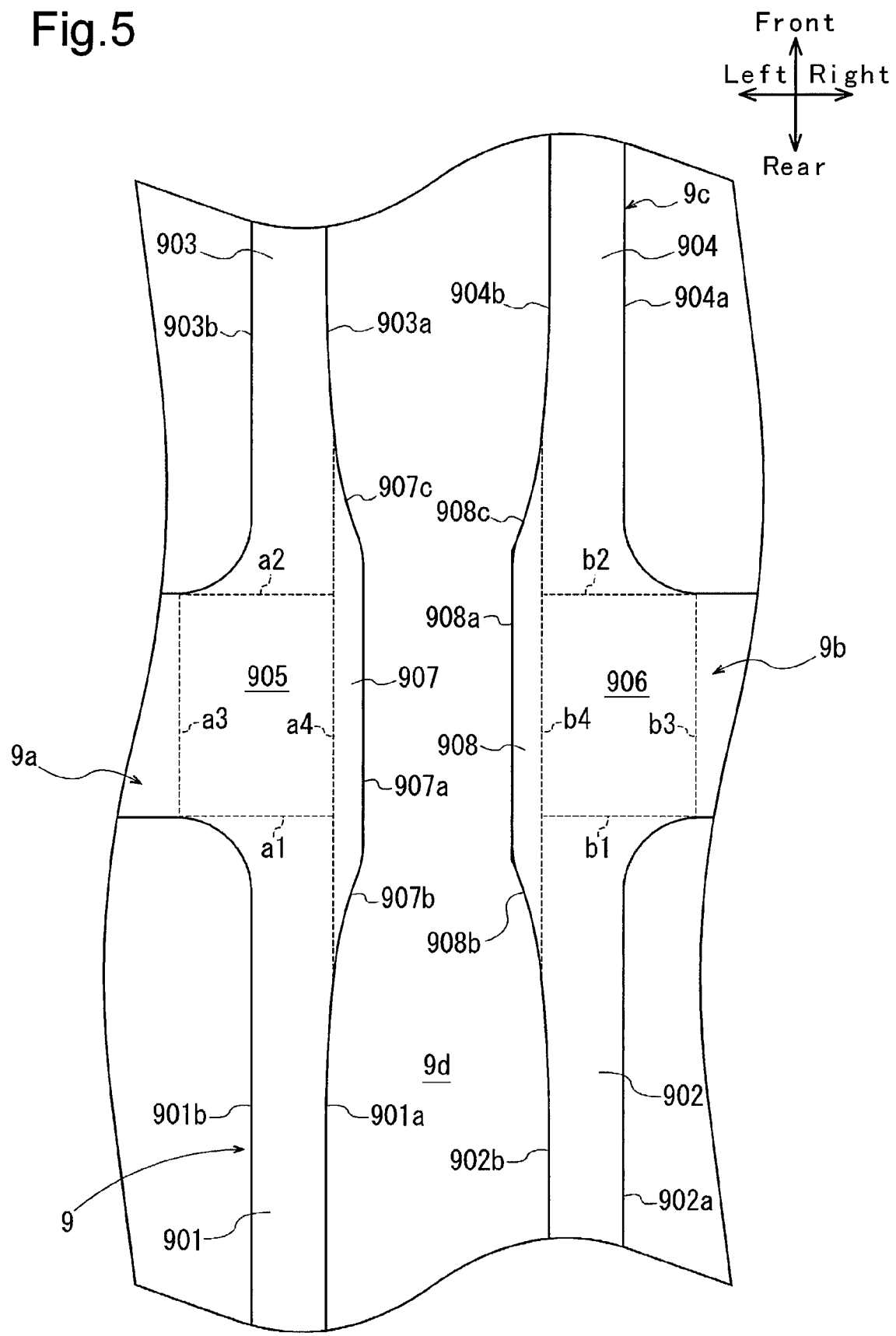
FIG. 5 is a partially enlarged top view showing a region X1 of FIG. 4.

FIG. 5 is an enlarged view of a region X1 shown in FIG. 4. As shown in FIG. 5, the first junction 905 is located in the middle in the front-rear direction of the connection body 9c at the left side of the interconnector 9. More specifically, the first junction 905 is a rectangular portion of the connection body 9c defined by broken lines a1 to a4. The broken lines a1 to a4 shown in FIG. 5 and FIG. 13, which will be described later, are used to illustrate, for example, the first junction 905 and the first reinforcement portion 907. The positions of the broken lines a1 to a4 are not limited to those shown in FIGS. 5 and 13. The same applies to broken lines b1 to b4 related to the second junction 906 and the second reinforcement portion 908, which will be described later.

The first junction 905 has a left end connected to the first electrode 9a. Thus, the first junction 905 is integral with the first electrode 9a. The first junction 905 extends from the first electrode 9a toward the right of the interconnector 9 and is connected to the first reinforcement portion 907 at the side opposite to the first electrode 9a. Additionally, the rear first detour 901 is connected to the rear of the first junction 905, and the front first detour 903 is connected to the front of the first junction 905.

As described above, each of the rear first detour 901 and the front first detour 903 linearly extends. Thus, the rear first detour 901 linearly extends from the rear toward the front and connects with the first junction 905 from the rear. The front first detour 903 linearly extends from the front toward the rear and connects with the first junction 905 from the front. The left edge 901b of the rear first detour 901 extends from the rear and is curved toward the first electrode 9a. More specifically, the left edge 901b of the rear first detour 901 extends toward the first junction 905 in a manner curved toward the left of the interconnector 9 and connects with the first junction 905. Also, the left edge 903b of the front first detour 903 extends from the front and is curved toward the first electrode 9a. More specifically, the left edge 903b of the front first detour 903 extends toward the first junction 905 in a manner curved toward the left of the interconnector 9 and connects with the first junction 905.

The first reinforcement portion 907 is located in the middle in the front-rear direction of the connection body 9c near the first junction 905, the rear first detour 901, and the front first detour 903. More specifically, the first reinforcement portion 907 is a portion of the connection body 9*c* located at the right side of the broken line a4 with respect to the first junction 905, the rear first detour 901, and the front first detour 903. The first junction 905, the rear first detour 901, and the front first detour 903 are connected to the left side of the first reinforcement portion 907. The first reinforcement portion 907 extends rightward from the first junction 905, the rear first detour 901, and the front first detour 903 toward the second reinforcement portion 908.

The first reinforcement portion 907 includes a first edge 907*a*, a rear first connection edge 907*b*, and a front first connection edge 907*c*. The rear first connection edge 907*b* and the front first connection edge 907*c* correspond to a first connection edge. The first edge 907*a* is the rightmost part of the first reinforcement portion 907. More specifically, the first edge 907*a* is the right end of the first reinforcement portion 907. In the first reinforcement portion 907, the first edge 907*a* linearly extends in the front-rear direction. The rear first connection edge 907*b* connects with the rear end of the first edge 907*a* and extends rearward from the first edge 907*a*. The front first connection edge 907*c* connects with the front end of the first edge 907*a* and extends frontward from the first edge 907*a*. As the rear first connection edge 907*b* and the front first connection edge 907*c* extend away from the first edge 907*a*, the rear first connection edge 907*b* and the front first connection edge 907*c* are inclined leftward toward the rear first detour 901 and the front first detour 903. The first reinforcement portion 907 has the form of a mountain having a flat top defined by the first edge 907*a*, the rear first connection edge 907*b*, and the front first connection edge 907*c*.

As described above, the first reinforcement portion 907 is connected to the first junction 905, the rear first detour 901, and the front first detour 903. Thus, the rear first connection edge 907*b* is connected to the right edge 901*a* of the rear first detour 901. In the same manner, the front first connection edge 907*c* is connected to the right edge 903*a* of the front first detour 903. This integrally connects the first reinforcement portion 907 to the rear first detour 901 and the front first detour 903.

As shown in FIGS. 4 and 5, the rear second detour 902 and the front second detour 904 are symmetrical at the front and rear sides and extend parallel to the rear first detour 901 and the front second detour 903, respectively. The rear second detour 902 includes a right edge 902*a* and a left edge 902*b*. The front second detour 904 includes a right edge 904*a* and a left edge 904*b*. As shown in FIG. 5, the second junction 906 is a rectangular portion of the connection body 9*c* defined by the broken lines b1 to b4 and has a right end connected to the second electrode 9*b*. The second reinforcement portion 908 is located at the left side of the broken line b4 with respect to the second junction 906, the rear second detour 902, and the front second detour 904. The second reinforcement portion 908 extends leftward from the second junction 906, the rear second detour 902, and the front second detour 904 toward the first reinforcement portion 907. The second reinforcement portion 908 includes a second edge 908*a*, a rear second connection edge 908*b*, and a front second connection edge 908*c*. The rear second connection edge 908*b* and the front second connection edge 908*c* correspond to a second connection edge. In the same manner as the rear first detour 901, the front first detour 903, the first junction 905, and the first reinforcement portion 907 described above, the rear second detour 902, the front second detour 904, the second junction 906, and the second reinforcement portion 908 are connected to each other. The shapes of the first and second reinforcement portions 907 and 908 including the shapes of the first and second edges 907*a* and 908*a* are examples, and the first and second reinforcement portions 907 and 908 may have other shapes.

The first junction 905, the rear first detour 901, the front first detour 903, and the first reinforcement portion 907 are integrated with each other. The second junction 906, the rear second detour 902, the front second detour 904, and the second reinforcement portion 908 are integrated with each other.

As shown in FIG. 4, the first joint 909 is located at the rear end of the connection body 9*c*. The first joint 909 extends in the sideward direction as a single line curved in the shape of a semicircle toward the rear end of each of the rear first detour 901 and the rear second detour 902. The second joint 910 is located at the front end of the connection body 9*c*. The second joint 910 extends in the sideward direction as a single line curved in the shape of a semicircle toward the front end of each of the front first detour 903 and the front second detour 904.

The first joint 909 connects the rear end of the rear first detour 901 and the rear end of the rear second detour 902. The second joint 910 connects the front end of the front first detour 903 and the front end of the front second detour 904. Thus, in the interconnector 9, the first electrode 9*a* and the second electrode 9*b* are connected by the connection body 9*c*. This allows the first electrode 9*a* and the second electrode 9*b* to be electrically connected via the connection body 9*c*.

As described above, when the first electrode 9*a* and the second electrode 9*b* are connected by the connection body 9*c*, the interconnector 9 has a central portion including a void 9*d* extending in the front-rear and sideward directions. The void 9*d* spaces apart the group of the rear first detour 901, the first junction 905, the first electrode 9*a*, the front first detour 903, and the first reinforcement portion 907 from the group of the rear second detour 902, the second junction 906, the second electrode 9*b*, the front second detour 904, and the second reinforcement portion 908 in the sideward direction.

As shown in FIG. 3, the first link 15*a* connects the front-most one of the three interconnectors 9 forming the interconnector group 90 and the second front-most one of the three interconnectors 9 forming the interconnector group 90. More specifically, the first link 15*a* is connected to the first joint 909 of the front-most interconnector 9 and the second joint 910 of the second front-most interconnector 9. Also, in the same manner, the second link 15*b* is connected to the first joint 909 of the second front-most interconnector 9 and the second joint 910 of the third front-most one of the three interconnectors 9 forming the interconnector group 90.

In each interconnector 9, the first electrode 9*a* is connected to the first photovoltaic cell 3 so that the first electrode 9*a* is electrically connected to the conductive portion of the first photovoltaic cell 3. Also, the second electrode 9*b* is connected to the second photovoltaic cell 5 so that the second electrode 9*b* is electrically connected to the conductive portion of the second photovoltaic cell 5. As described above, the lower surface 3*b* of the first photovoltaic cell 3 and the lower surface 5*b* of the second photovoltaic cell 5 include the conductive portions. Thus, as shown in FIG. 2, the first electrode 9*a* is connected to the lower surface 3*b* of the first photovoltaic cell 3. The second electrode 9*b* is connected to the lower surface 5*b* of the second photovoltaic cell 5. To simplify the illustration, the shape of the interconnectors 9 is simplified in FIGS. 2 and 5 to 7. Alternatively, the upper surface 3a of the first photovoltaic cell 3 and the upper surface 5a of the second photovoltaic cell 5 may include the conductive portions. In this case, the first electrode 9a is connected to the upper surface 3a of the first photovoltaic cell 3, and the second electrode 9b is connected to the upper surface 5a of the second photovoltaic cell 5.

As shown in FIG. 3, the interconnector group 90 is located between the first photovoltaic cell 3 and the second photovoltaic cell 5. Additionally, as shown in FIG. 2, the interconnector group 90 is located parallel to the first photovoltaic cell 3 and the second photovoltaic cell 5. In the solar panel, adjacent ones of the first photovoltaic cells 3 and the second photovoltaic cells 5 in the sideward direction are electrically connected by the interconnector group 90, ultimately, the interconnectors 9. As shown in FIG. 3, the first photovoltaic cell 3 and the second photovoltaic cell 5 are separated from each other by the interval W1. The interconnector group 90 is located between the first photovoltaic cell 3 and the second photovoltaic cell 5.

The encapsulation member 11, which is shown in FIG. 2, includes ethylene-vinyl acetate copolymer (EVA). The encapsulation member 11 includes encapsulation sheets 11a and 11b, which will be described later. The first and second photovoltaic cells 3 and 5, the tab wires 7a and 7b, and the interconnector group 90 are located between the protection plate 1 and the back panel 13, more specifically, between the lower surface 1b of the protection plate 1 and an upper surface 13a of the back panel 13. The first and second photovoltaic cells 3 and 5, the tab wires 7a and 7b, and the interconnector group 90 are encapsulated and fixed to one another by the encapsulation member 11. Thus, the encapsulation member 11 is integrated with the protection plate 1 and the back panel 13 while protecting the first and second photovoltaic cells 3 and 5 from wear caused by, for example, moisture or oxygen. The encapsulation member 11 also includes a first silicon resin 17a and a second silicon resin 17b, which will be described later. The encapsulation member 11 may include, for example, an ionomer resin, a silicon resin, or polyolefin, instead of EVA described above.

The back panel 13 is formed by a metal plate of, for example, an aluminum alloy. The back panel 13 is flat and rectangular. The back panel 13 includes the upper surface 13a and a lower surface 13b, which is opposite to the upper surface 13a. The upper surface 13a is opposed to the lower surface 1b of the protection plate 1, the first and second photovoltaic cells 3 and 5, and the encapsulation member 11. The back panel 13, which is located at a lower surface side of the encapsulation member 11, protects the first and second photovoltaic cells 3 and 5 from wear caused by, for example, moisture or oxygen together with the encapsulation member 11. Additionally, the back panel 13 increases the rigidity of the solar panel. Thus, even when the protection plate 1 is not adequately rigid, the rigidity of the solar panel is ensured. Alternatively, the back panel 13 may be formed from a resin such as carbon fiber reinforced plastic (CFRP). When the protection plate 1 is formed from a resin as described above and the back panel 13 is also formed from the same resin as of the material of the protection plate 1, the protection plate 1 and the back panel 13 may together have a structure that ensures the rigidity necessary for the solar panel. When the protection plate 1 is rigid enough to ensure the rigidity of the solar panel, for example, a thin film formed from polyetherketone (PEK) may be used as the back cover instead of the back panel 13.

The first and second photovoltaic cells 3 and 5 are adhered to the back panel 13 by the first and second silicon resins 17a and 17b, respectively. More specifically, the upper surface 13a of the back panel 13 adheres to the lower surface 3b of each first photovoltaic cell 3 with the first silicon resin 17a. The upper surface 13a of the back panel 13 adheres to the lower surface 5b of each second photovoltaic cell 5 with the second silicon resin 17b. The first silicon resin 17a and the second silicon resin 17b may have the same material. Alternatively, the first silicon resin 17a and the second silicon resin 17b may have different materials taking into consideration other conditions.

Figure 6:
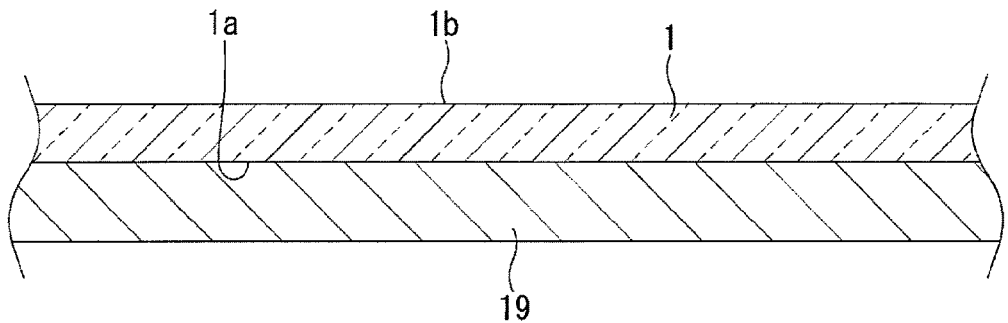
FIG. 6 is a cross-sectional view showing a preparing step of a process for manufacturing the solar panel of FIG. 1.

The solar panel is manufactured as described below. As shown in FIG. 6, a heatable vacuum-forming jig 19 is prepared as a preparing step. A preformed protection plate 1 is placed on the vacuum-forming jig 19. In this step, the protection plate 1 is placed on the vacuum-forming jig 19 with the upper surface 1a opposed to the vacuum-forming jig 19.

Figure 7:
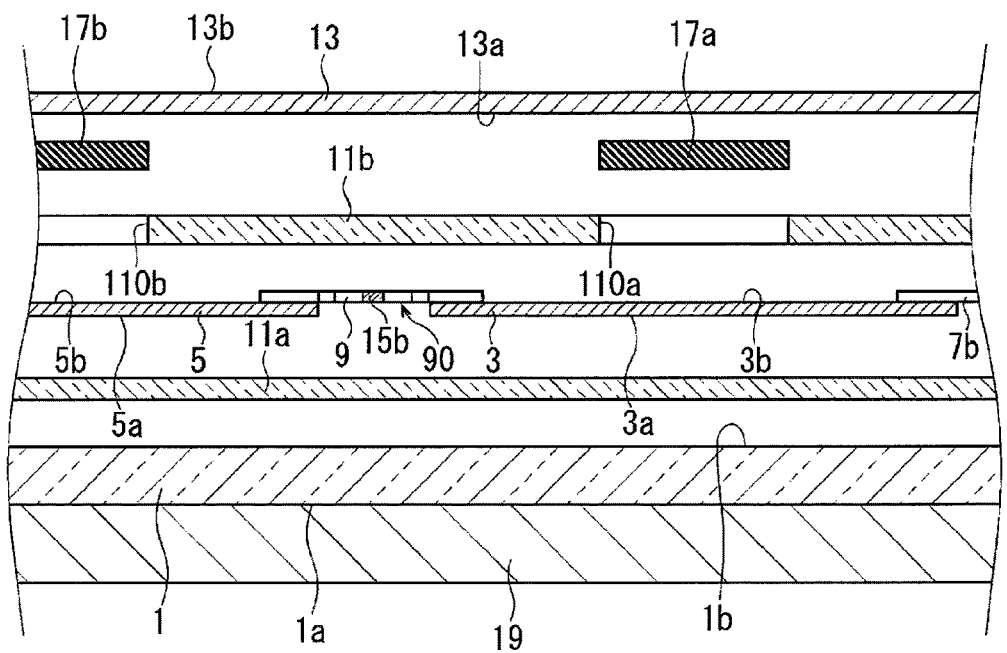
FIG. 7 is a cross-sectional view showing an encapsulating step of the process for manufacturing the solar panel of FIG. 1.

As shown in FIG. 7, as an encapsulating step, the encapsulation sheet 11a, the first and second photovoltaic cells 3 and 5, the tab wires 7a and 7b, the interconnector group 90, and the encapsulation sheet 11b are sequentially placed on the lower surface 1b of the protection plate 1. The first and second photovoltaic cells 3 and 5 are electrically connected to each other by the tab wires 7a and 7b and the interconnector group 90.

The encapsulation sheet 11b includes first cutaway portions 110a in positions opposed to the lower surfaces 3b of the first photovoltaic cells 3 and second cutaway portions 110b in positions opposed to the lower surfaces 5b of the second photovoltaic cells 5. The encapsulation sheet 11b includes the first cutaway portions 110a and the second cutaway portions 110b in accordance with the number of the first photovoltaic cells 3 and the second photovoltaic cells 5, respectively. Each of the first cutaway portions 110a is filled with the first silicon resin 17a. Each of the second cutaway portions 110b is filled with the second silicon resin 17b. Subsequently, the back panel 13 is placed on the encapsulation sheet 11b with the upper surface 13a opposed to the lower surface 1b of the protection plate 1.

Figure 8:
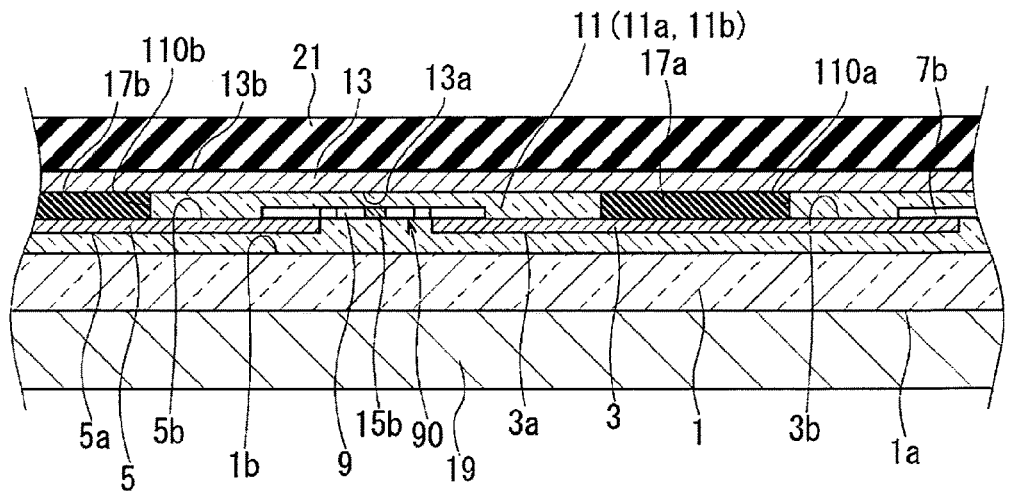
FIG. 8 is a cross-sectional view showing a laminating step of the process for manufacturing the solar panel of FIG. 1.

As shown in FIG. 8, a laminating step is performed. More specifically, as shown in FIG. 8, while a diaphragm 21 is pressed onto the vacuum-forming jig 19, a vacuum state is obtained between the vacuum-forming jig 19 and the diaphragm 21, that is, between the components of the solar panel described above. Additionally, at the same time as the pressing of the diaphragm 21, the vacuum-forming jig 19 is heated to soften the encapsulation sheets 11a and 11b and adhere the components to each other. Consequently, the first and second photovoltaic cells 3 and 5, the tab wires 7a and 7b, and the interconnector group 90 are encapsulated and fixed to one another between the lower surface 1b of the protection plate 1 and the upper surface 13a of the back panel 13. Additionally, the first photovoltaic cells 3 adhere to the back panel 13 with the first silicon resin 17a, and the second photovoltaic cells 5 adhere to the back panel 13 with the second silicon resin 17b. As a result, the solar panel is completed.

As shown in FIG. 3, in the solar panel, the interconnector group 90 electrically connects adjacent ones of the first photovoltaic cells 3 and the second photovoltaic cells 5 in the sideward direction. In each interconnector 9 of the interconnector group 90, the first electrode 9a and the second electrode 9b are connected by the connection body 9c. Thus, in the solar panel, during manufacturing or after installation, if heat caused by changes in the temperature expands or contracts the first photovoltaic cell 3 and the second photovoltaic cell 5 and changes the interval W1 shown in FIG. 3 to an interval W2 shown in FIG. 9 or an interval W3 shown in FIG. 10, the interval between the first electrode 9a and the second electrode 9b is changed in the interconnector 9, accordingly.

Figure 9:
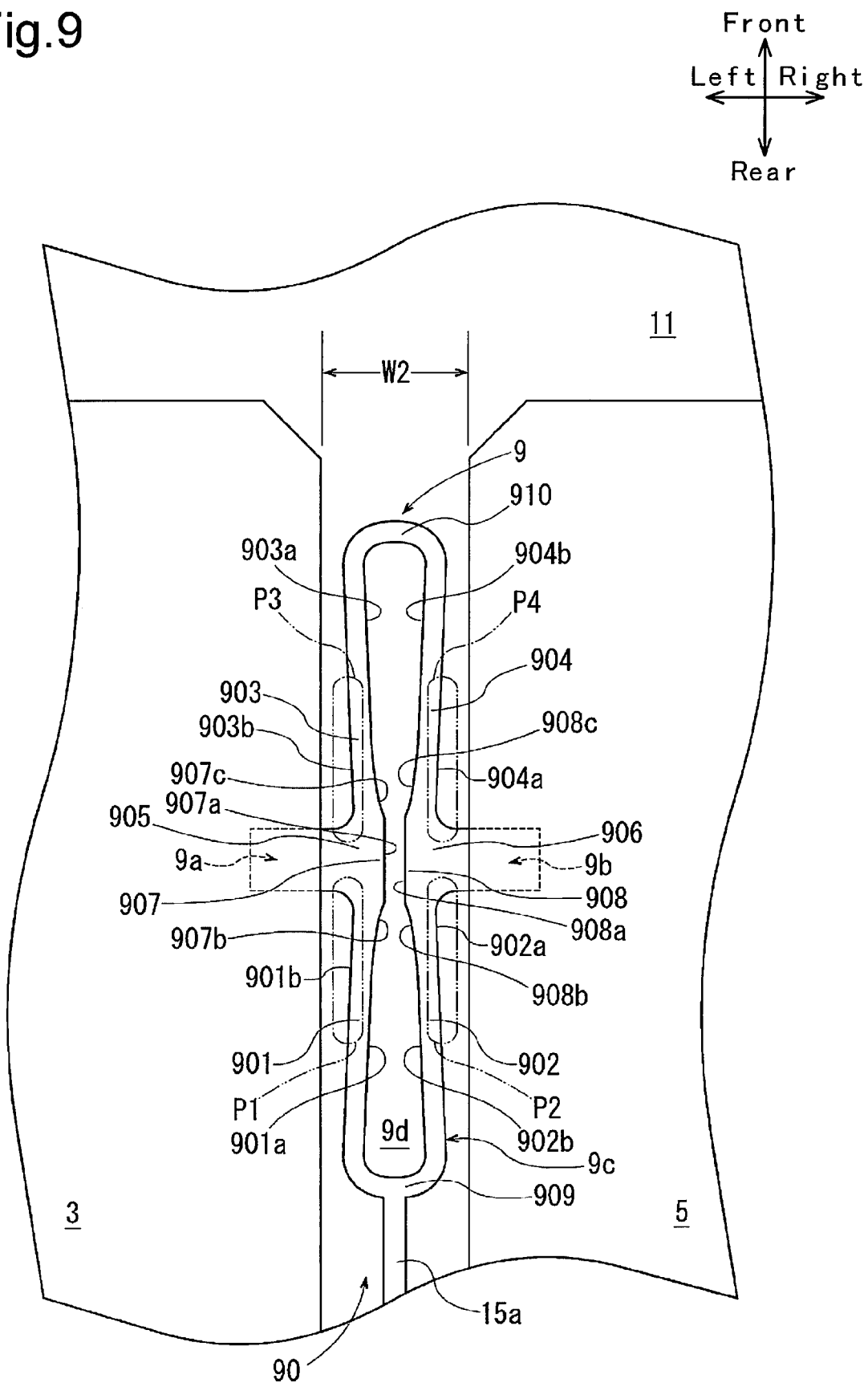
FIG. 9 is an enlarged top view showing a region Y1 of FIG. 3 when the solar panel of FIG. 1 is contracted.

More specifically, as shown in FIG. 9, when changes in the temperature contract the solar panel, the first photovoltaic cell 3 and the second photovoltaic cell 5 move close to each other in the sideward direction. As a result, the interval between the first photovoltaic cell 3 and the second photovoltaic cell 5 is the interval W2 and is narrower than the interval W1 shown in FIG. 3. Accordingly, the connection body 9c of each interconnector 9 deforms like a pantograph. More specifically, as shown in FIG. 9, in the connection body 9c of the interconnector 9, the rear first detour 901 and the rear second detour 902 deform to be closer to each other in the sideward direction as compared to the states shown in FIGS. 3 and 4. In the same manner, the front first detour 903 and the front second detour 904 deform to be closer to each other in the sideward direction.

Consequently, the first electrode 9a, the first junction 905, the first reinforcement portion 907 and the second electrode 9b, the second junction 906, and the second reinforcement portion 908 move closer to each other in the sideward direction. The center void 9d in the interconnector 9 narrows as compared to the states shown in FIGS. 3 and 4.

In the interconnectors 9, when the solar panel contracts, the rear first and second detours 901 and 902 and the front first and second detours 903 and 904 are deformed so that the first electrode 9a and the second electrode 9b move closer to each other in the sideward direction while buffering the compression load applied by the first photovoltaic cells 3 and the second photovoltaic cells 5 in the sideward direction. Thus, even when changes in the temperature contract the solar panel and narrow the interval between the first photovoltaic cell 3 and the second photovoltaic cell 5, the resulting breakage of the interconnectors 9 in the thickness-wise direction is limited.

Figure 10:
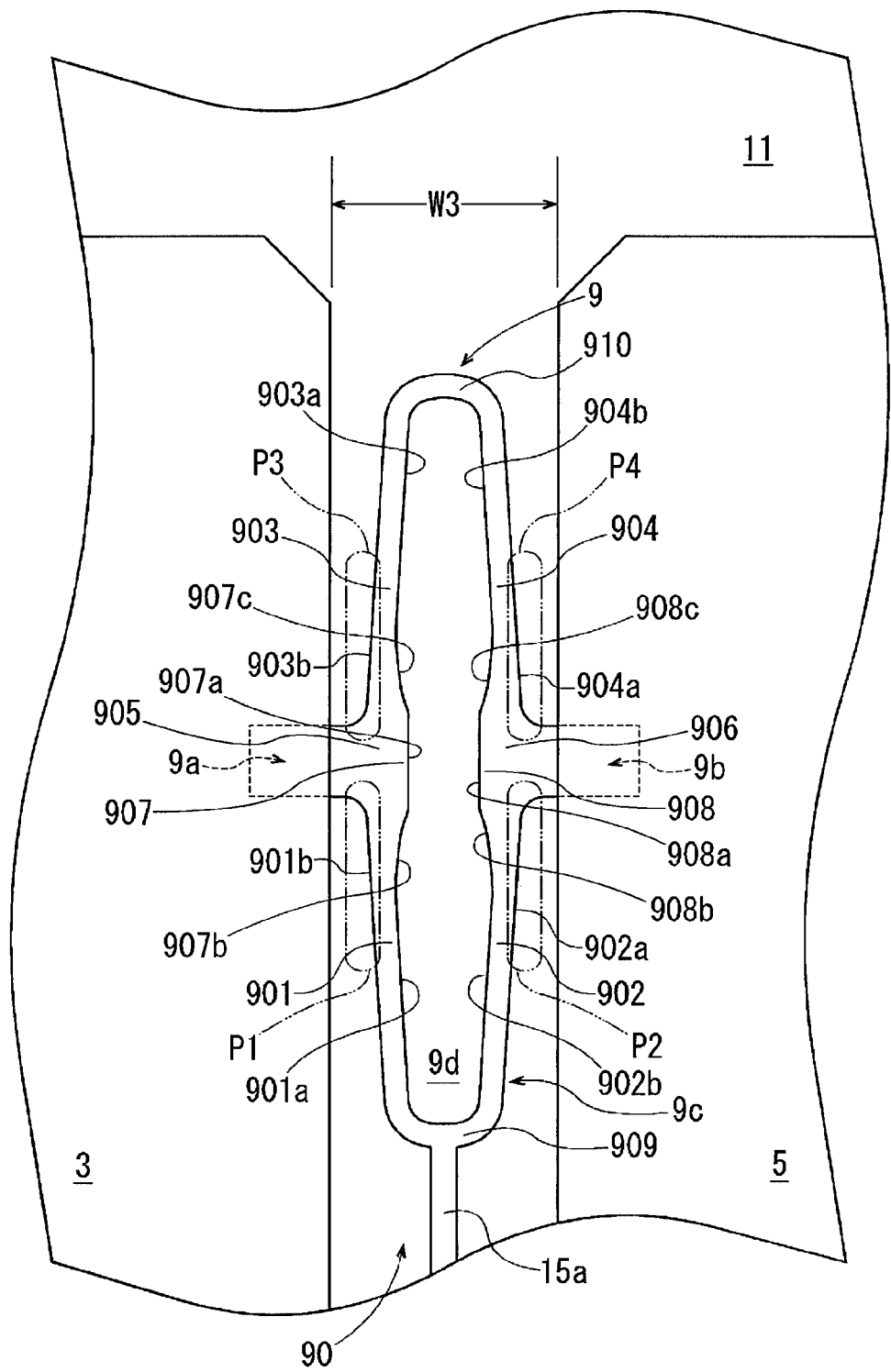
FIG. 10 is an enlarged top view showing the region Y1 of FIG. 3 when the solar panel of FIG. 1 is expanded.

As shown in FIG. 10, when the solar panel expands because of changes in temperature, the first photovoltaic cell 3 and the second photovoltaic cell 5 move away from each other in the sideward direction. As a result, the interval between the first photovoltaic cell 3 and the second photovoltaic cell 5 is an interval W3, which is wider than the interval W1 shown in FIG. 3. Accordingly, as shown in FIG. 10, the connection body 9c of the interconnector 9 deforms so that the rear first detour 901 and the rear second detour 902 move away from each other in the sideward direction as compared to the states shown in FIGS. 3 and 4. In the same manner, the front first detour 903 and the front second detour 904 deform to move away from each other in the sideward direction. Consequently, the first electrode 9a, the first junction 905, and the first reinforcement portion 907 and the second electrode 9b, the second junction 906, and the second reinforcement portion 908 move away from each other in the sideward direction. The center void 9d of the interconnector 9 widens as compared to the states shown in FIGS. 3 and 4. In the interconnectors 9, when the solar panel expands, the rear first and second detours 901 and 902 and the front first and second detours 903 and 904 are deformed so that the first electrode 9a and the second electrode 9b move away from each other in the sideward direction while buffering the tension load applied by the first photovoltaic cells 3 and the second photovoltaic cells 5 in the sideward direction. Thus, in the solar panel, even when the interval between the first photovoltaic cell 3 and the second photovoltaic cell 5 widens, the resulting separation of the first electrode 9a from the first photovoltaic cell 3 or the second electrode 9b from the second photovoltaic cell 5 is limited.

As shown in FIG. 5, in the interconnector 9, the first junction 905 connects the first electrode 9a, the rear first detour 901, and the front first detour 903. The second junction 906 connects the second electrode 9b, the rear second detour 902, and the front second detour 904. As indicated by imaginary lines shown in FIGS. 9 and 10, in the interconnector 9, when the connection body 9c deforms as described above, stress is generated in the connection body 9c in regions P1 to P4 indicated by the imaginary lines.

The region P1 includes the first junction 905 and the rear first detour 901. More specifically, the region P1 includes the left edge 901b of the rear first detour 901 in addition to the portion connecting the first junction 905 and the rear first detour 901. The region P2 includes the second junction 906 and the rear second detour 902. More specifically, the region P2 includes the right edge 902a of the rear second detour 902 in addition to the portion connecting the second junction 906 and the rear second detour 902. The region P3 includes the first junction 905 and the front first detour 903. More specifically, the region P3 includes the left edge 903b of the front first detour 903 in addition to the portion connecting the first junction 905 and the front first detour 903. The region P4 includes the second junction 906 and the front second detour 904. More specifically, the region P4 includes the right edge 904a of the front second detour 904 in addition to the portion connecting the second junction 906 and the front second detour 904.

As shown in FIG. 5, the connection body 9c includes the first reinforcement portion 907 and the second reinforcement portion 908. The first reinforcement portion 907 is connected to the first junction 905, the rear first detour 901, and the front first detour 903. The first reinforcement portion 907 extends rightward from the first junction 905, the rear first detour 901, and the front first detour 903 toward the second reinforcement portion 908. The second reinforcement portion 908 is connected to the second junction 906, the rear second detour 902, and the front second detour 904. The second reinforcement portion 908 extends leftward from the second junction 906, the rear second detour 902, and the front second detour 904 toward the first reinforcement portion 907. Thus, in the connection body 9c, the first reinforcement portion 907 reinforces the portion connecting the rear first detour 901, the front first detour 903, and the first junction 905 from a side opposite to the region P1 and the region P3. In the same manner, the second reinforcement portion 908 reinforces the portion connecting the rear second detour 902, the front second detour 904, and the second junction 906 from a side opposite to the region P2 and the region P4. Thus, in the interconnector 9, even when stress is generated in the regions P1 to P4 by deformation of the connection body 9c, the first reinforcement portion 907 and the second reinforcement portion 908 limit breakage of the portion of the first junction 905 connected to the rear first detour 901 and the front first detour 903 and the portion of the second junction 906 connected to the rear second detour 902 and the front second detour 904. Thus, in the interconnector 9, breakage of the connection body 9c is limited.

The first reinforcement portion 907 is integrally connected to the rear first detour 901 and the front first detour 903 by the rear first connection edge 907b and the front first connection edge 907c. Thus, the first reinforcement portion 907 subtly hinders the deformation of the rear first detour 901 and the front first detour 903. The second reinforcement portion 908 also subtly hinders the deformation of the rear second detour 902 and the front second detour 904. In the interconnector 9, while reinforcing the connection body 9c as described above, the first and second reinforcement portions 907 and 908 allow the rear first and second detours 901 and 902 and the front first and second detours 903 and 904 to be appropriately deformed when the solar panel contracts because of changes in temperature. This appropriately limits occurrence of defective electrical connections between the first photovoltaic cell 3 and the second photovoltaic cell 5.

In the interconnector 9, the rear first detour 901 linearly extends rearward from the first junction 905, and the rear second detour 902 linearly extends rearward from the second junction 906. In the same manner, the front first and second detours 903 and 904 linearly extend frontward from the first and second junctions 905 and 906, respectively. In the interconnector 9, this allows the stress generated by deformation of the connection body 9c to be appropriately dispersed in the regions P1 to P4. Thus, in the interconnector 9, local concentration of stress on the first and second junctions 905 and 906, the rear first and second detours 901 and 902, and the front first and second detours 903 and 904 is limited when the connection body 9c deforms. In this point, breakage of the connection body 9c is limited. Since the rear first and second detours 901 and 902 and the front first and second detours 903 and 904 deform as described above, when the solar panel contracts or expands because of changes in temperature and the interval between the first photovoltaic cell 3 and the second photovoltaic cell 5 changes, the distance between the first photovoltaic cell 3 and the second photovoltaic cell 5 is likely to uniformly change.

Thus, even when the solar panel of the first embodiment expands or contracts because of changes in temperature, occurrence of defective electrical connections between the first photovoltaic cell 3 and the second photovoltaic cell 5 is limited, and a high durability is obtained.

In the solar panel, the first photovoltaic cells 3 are adhered to the back panel 13 with the first silicon resin 17a, and the second photovoltaic cells 5 are adhered to the back panel 13 with the second silicon resin 17b. Thus, the positioning of the first photovoltaic cells 3 and the second photovoltaic cells 5 is easily performed when the solar panel is manufactured. Additionally, when the back panel 13 expands or contracts because of changes in temperature during the manufacturing or use of the solar panel, the first photovoltaic cells 3 and the second photovoltaic cells 5 may move with reference to the back panel 13. Thus, in the solar panel, misalignments of the first photovoltaic cells 3 and the second photovoltaic cells 5 with the protection plate 1 are limited. Thus, when the solar panel expands or contracts because of changes in temperature, situations in which the first photovoltaic cells 3 and the second photovoltaic cells 5 are hidden by the body portion 10a or the connection portions 10b of the shield 10 as a result of the expansion or contraction are limited.

In the solar panel, the interconnector group 90 is formed by stamping a single copper plate (plate material). More specifically, in each interconnector 9, the first electrode 9a, the second electrode 9b, and the connection body 9c are formed of a single copper plate. Thus, in the solar panel, the interconnectors 9, and, ultimately, the interconnector group 90 is easily manufactured, and the manufacturing cost may be reduced.

In the solar panel, the three interconnectors 9 are connected by the first and second links 15a and 15b to be configured as the single interconnector group 90. Thus, in the interconnector group 90, the interval between the interconnectors 9 in the front-rear direction may be uniformly set by the first and second links 15a and 15b. In the solar panel, the positioning of the interconnectors 9 with respect to each other in the front-rear direction may be easier as compared to, for example, when adjacent ones of the first photovoltaic cell 3 and the second photovoltaic cell 5 in the sideward direction are connected by three independent interconnectors 9. In other words, in the solar panel, the interconnector group 90 eliminates the need of separately positioning the interconnectors 9 in the front-rear direction when connecting the first photovoltaic cell 3 and the second photovoltaic cell 5.

Second Embodiment

Figure 11:
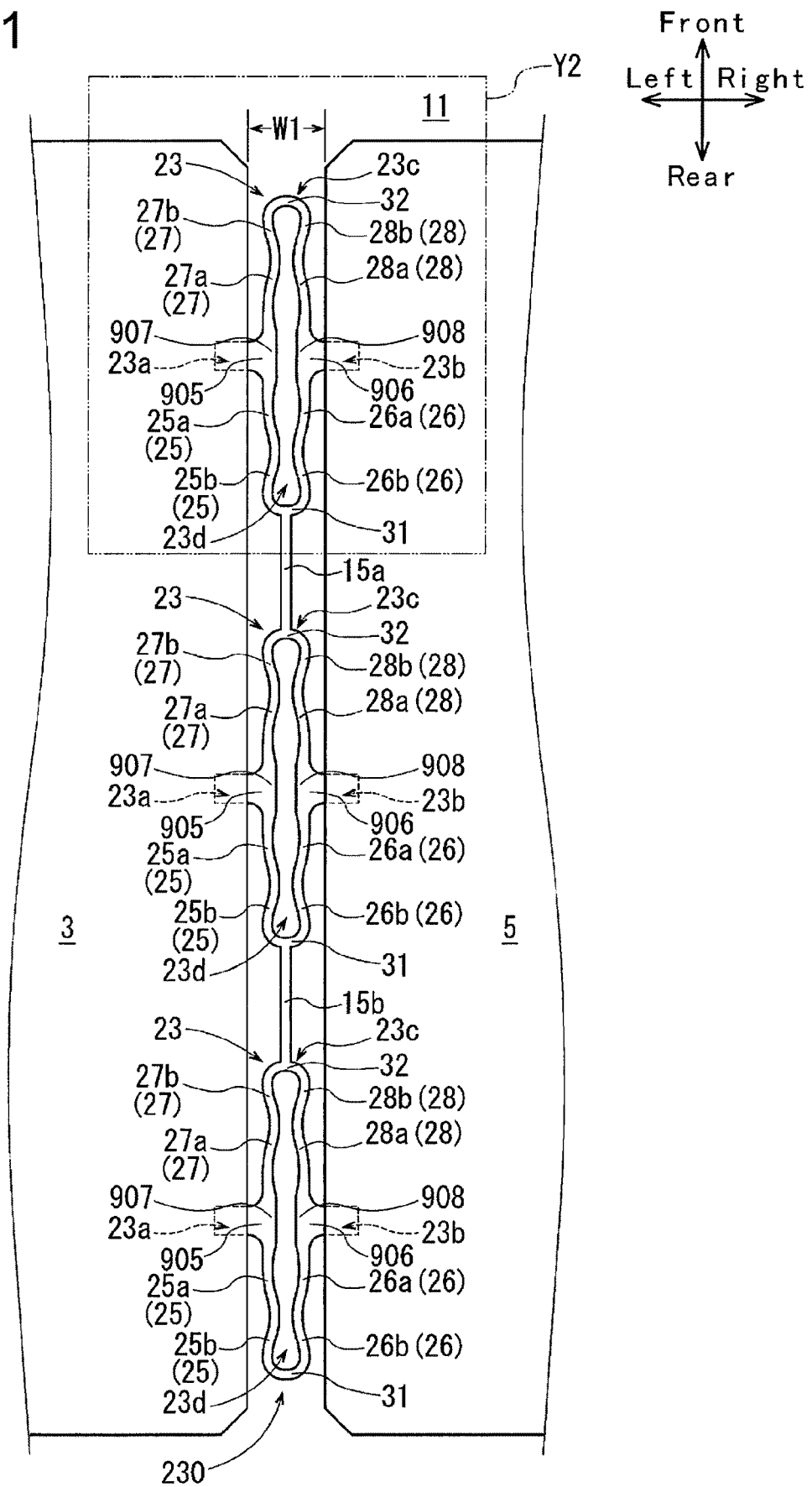
FIG. 11 is an enlarged top view showing a first photovoltaic cell, a second photovoltaic cell, and interconnectors in a second embodiment of a solar panel.

A second embodiment of a solar panel includes an interconnector group 230, which is shown in FIG. 11, instead of the interconnector group 90 of the solar panel of the first embodiment. The first and second links 15a and 15b connect three interconnectors 23 having identical shapes to form the interconnector group 230. The interconnector group 230 is also formed by stamping a copper plate. The number of the interconnectors 23 forming the interconnector group 230 may be changed to any number that is greater than or equal to two.

Figure 12:
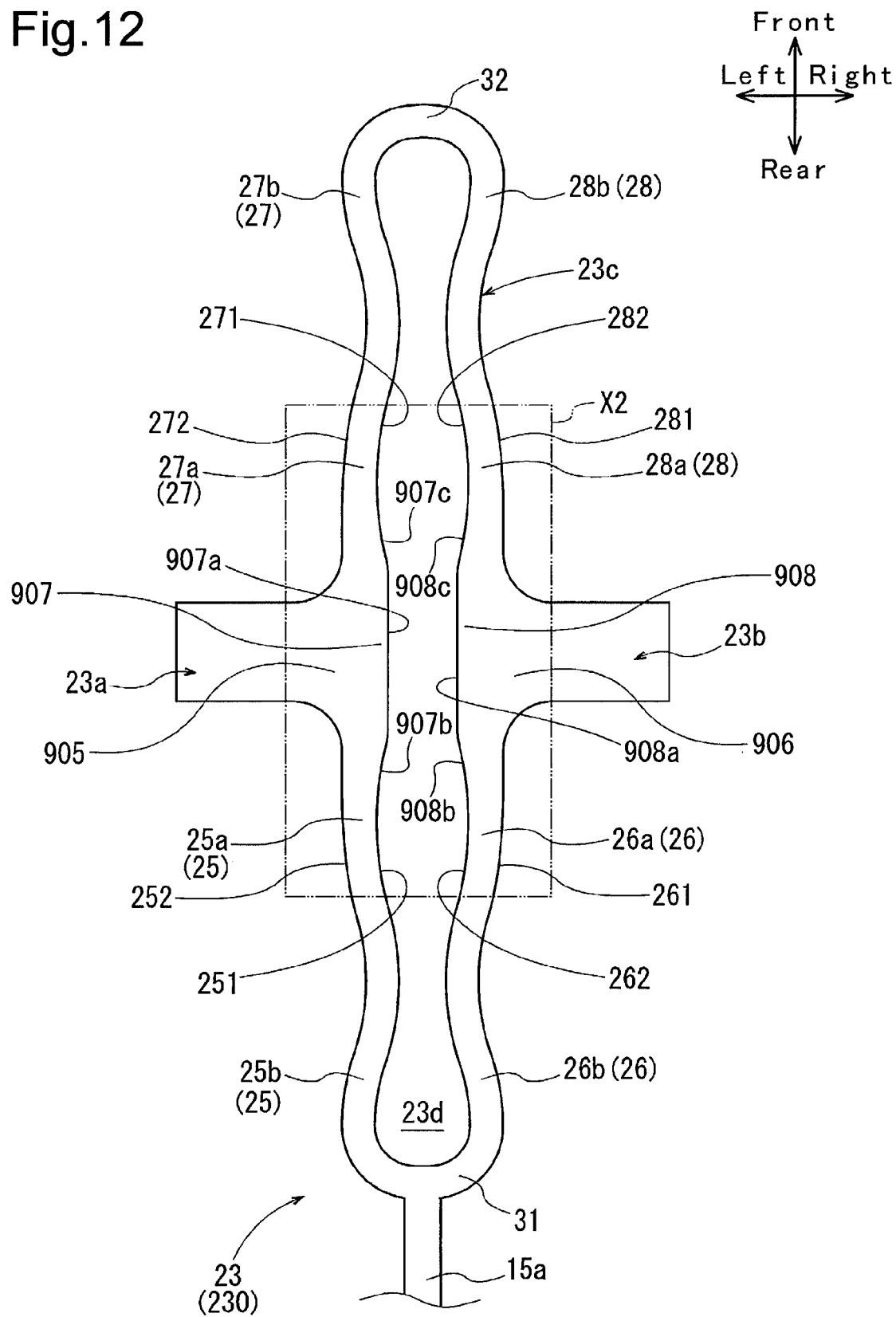
FIG. 12 is an enlarged top view showing one of the interconnections shown in FIG. 11.

As shown in FIG. 12, the interconnector 23 includes a first electrode 23a, a second electrode 23b, and a connection body 23c. The first electrode 23a and the first electrode 9a have the same shape. The second electrode 23b and the second electrode 9b have the same shape.

The connection body 23c has the form of a fine line in a plan view. The connection body 23c includes a rear first detour 25, a rear second detour 26, a front first detour 27, a front second detour 28, the first and second junctions 905 and 906, the first and second reinforcement portions 907 and 908, and first and second joints 31 and 32. The rear first detour 25 and the front first detour 27 also correspond to the first detour. In the same manner, the rear second detour 26 and the front second detour 28 also correspond to the second detour. In the connection body 23c, the first junction 905 is connected to the first electrode 23a, and the second junction 906 is connected to the second electrode 23b.

The rear first detour 25 and the front first detour 27 are located at the left side of the interconnector 23. The rear second detour 26 and the front second detour 28 are located at the right side of the interconnector 23.

In the interconnector 23, the rear first detour 25 and the rear second detour 16 are symmetrical at the left and right sides. Also, the front first detour 27 and the front second detour 28 are symmetrical at the left and right sides. Thus, hereafter, the configurations of the rear first detour 25 and the front first detour 27 will be described in detail, and the configurations of the rear second detour 26 and the front second detour 28 will not be described in detail.

The rear first detour 25 extends from the first junction 905 away from the first electrode 23a as a single line curved toward the rear of the interconnector 23. The rear first detour 25 includes a rear first curved part 25a and a rear first away part 25b. The rear first curved part 25a is curved in the shape of S in the sideward direction. More specifically, as the rear first curved part 25a extends rearward away from the first electrode 23a, the rear first curved part 25a is gradually curved leftward away from the rear second detour 26 and then rightward again toward the rear second detour 26. The rear first away part 25b is continuous with the rear end of the rear first curved part 25a and curved leftward away from the rear second detour 26. The rear first detour 25 includes a right edge 251 and a left edge 252. The right edge 251 and the left edge 252 are curved in the sideward direction in conformance with the shapes of the rear first curved part 25*a* and the rear first away part 25*b*.

The front first detour 27 extends from the first junction 905 away from the first electrode 23*a* as a single line curved toward the front of the interconnector 23. The front first detour 27 includes a front first curved part 27*a* and a front first away part 27*b*. The rear first away part 25*b* and the front first away part 27*b* correspond to a first away part. The front first detour 27 includes a right edge 271 and a left edge 272. The front first detour 27 and the rear first detour 25 are symmetrical at the front and rear sides. Thus, the specific configuration of the front first detour 27 will not be described and instead refer to the description of the rear first detour 25.

Figure 13:
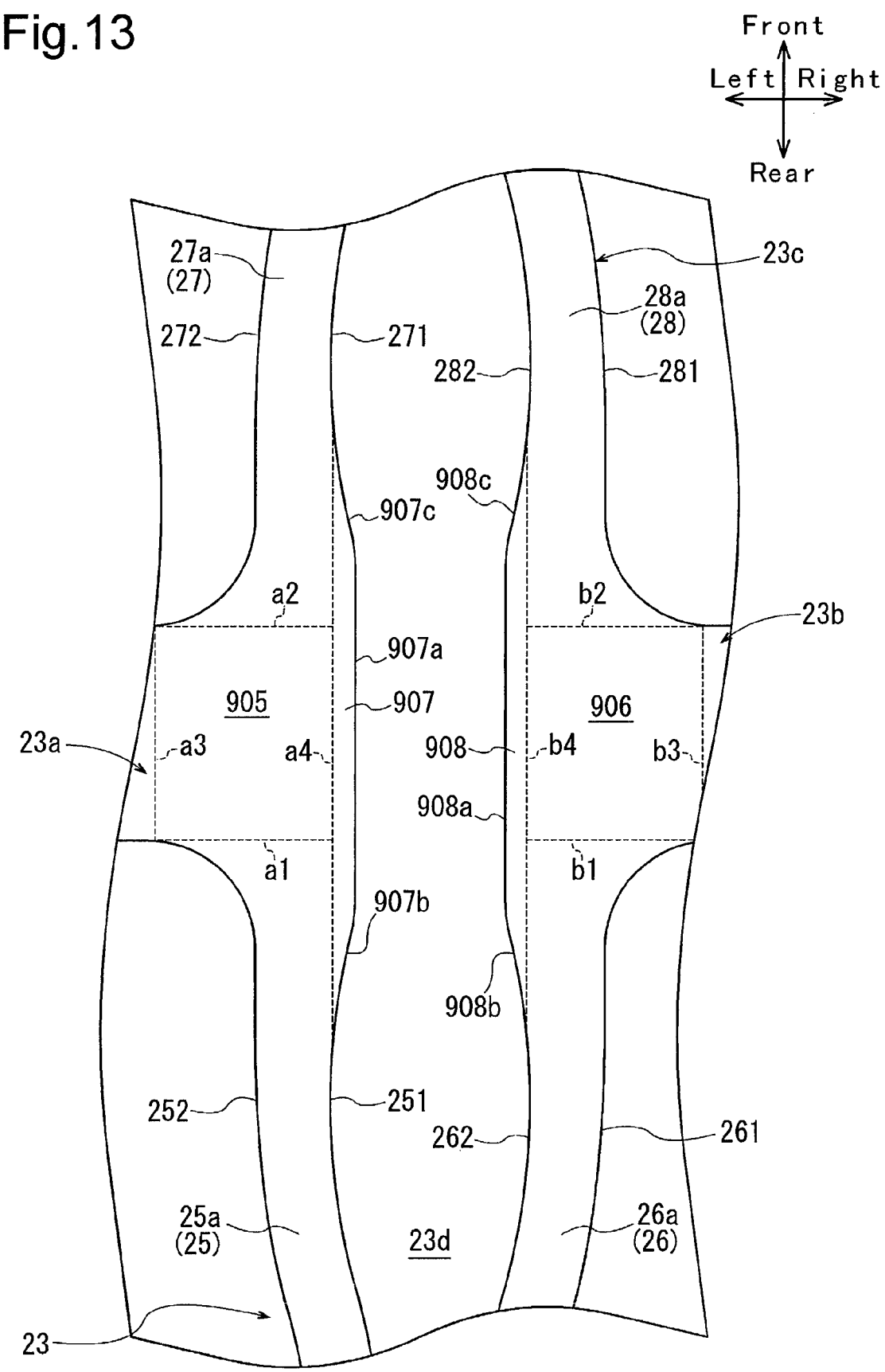
FIG. 13 is a partially enlarged top view showing a region X2 of FIG. 12.

FIG. 13 is an enlarged view of a region X2 shown in FIG. 12. As shown in FIG. 13, in the interconnector 23, the rear first curved part 25*a* of the rear first detour 25 is connected to the rear of the first junction 905, and the front first curved part 27*a* of the front first detour 27 is connected to the front of the first junction 905. The first reinforcement portion 907 is connected to the first junction 905, the rear first detour 25, and the front first detour 27. Thus, the rear first connection edge 907*b* is connected to the right edge 251 of the rear first detour 25. In the same manner, the front first connection edge 907*c* is connected to the right edge 271 of the front first detour 27. Thus, the first reinforcement portion 907 is integrally connected to the rear first detour 25 and the front first detour 27.

As shown in FIGS. 12 and 13, the rear second detour 26 and the front second detour 28 are symmetrical at the front and rear sides. The rear second detour 26 includes a rear second curved part 26*a* and a rear side second away part 26*b*. The front second detour 28 includes a front second curved part 28*a* and a front second away part 28*b*. The rear side second away part 26*b* and the front second away part 28*b* correspond to a second away part. The rear second detour 26 and the front second detour 28 include front edges 261 and 281 and left edges 262 and 282, respectively. In the same manner as the rear first detour 25, the front first detour 27, the first junction 905, and the first reinforcement portion 907, the rear second detour 26, the front second detour 28, the second junction 906, and the second reinforcement portion 908 are connected to each other.

The rear first and second detours 25 and 26 and the front first and second detours 27 and 28 are each curved. The rear first detour 25 is curved extending rearward from the first junction 905, and the rear second detour 26 is curved extending rearward from the second junction 906. In the same manner, the front first and second detours 27 and 28 are curved extending frontward from the first and second junctions 905 and 906, respectively. In the rear first detour 25 and the front first detour 27, the left edges 252 and 272 extend in a manner curved toward the left of the interconnector 23 and connect with the first junction 905. In the rear second detour 26 and the front second detour 28, the front edges 261 and 281 extend in a manner curved toward the right of the interconnector 23 and connect with the second junction 906.

In the connection body 23*c*, the first junction 905, the rear first detour 25, the front first detour 27, and the first reinforcement portion 907 are integrated with each other. Also, the second junction 906, the rear second detour 26, the front second detour 28, and the second reinforcement portion 908 are integrated with each other.

As shown in FIG. 12, the first joint 31 is located at the rear end of the connection body 23*c*. The first joint 31 extends in the sideward direction as a single line curved in the shape of a semicircle toward the rear end of each of the rear first away part 25*b* and the rear side second away part 26*b*. The first joint 31, which is connected to the rear end of each of the rear first away part 25*b* and the rear side second away part 26*b*, connects the rear first detour 25 and the rear second detour 26.

The second joint 32 is located at the front end of the connection body 23*c*. The second joint 32 extends in the sideward direction as a single line curved in the shape of a semicircle toward the front end of each of the front first away part 27*b* and the front second away part 28*b*. The second joint 32, which is connected to the front end of each of the front first away part 27*b* and the front second away part 28*b*, connects the front first detour 27 and the front second detour 28.

In the interconnector 23, the connection body 23*c* connects the first electrode 23*a* and the second electrode 23*b*. This allows the first electrode 23*a* and the second electrode 23*b* to be electrically connected via the connection body 23*c*. Additionally, the interconnector 23 has a central portion including a void 23*d* extending in the front-rear and sideward directions. The void 23*d* spaces apart the group of the rear first detour 25, the first junction 905, the first electrode 23*a*, the front first detour 27, and the first reinforcement portion 907 from the group of the rear second detour 26, the second junction 906, the second electrode 23*b*, the front second detour 28, and the second reinforcement portion 908 in the sideward direction.

As shown in FIG. 11, in the interconnector group 230, the first link 15*a* is connected to the first joint 31 of the front-most interconnector 23 and the second joint 32 of the second front-most interconnector 23. The second link 15*b* is connected to the first joint 31 of the second front-most interconnector 23 and the second joint 32 of the third front-most interconnector 23.

In this solar panel, adjacent ones of the first photovoltaic cells 3 and the second photovoltaic cells 5 in the sideward direction are electrically connected by the interconnectors 23. Thus, in the solar panel, the interconnector group 230 separates the first photovoltaic cell 3 from the second photovoltaic cell 5 with the interval W1. The other components of the solar panel are the same as those of the solar panel of the first embodiment. The same reference characters are given to those components. Such components will not be described in detail.

Figure 14:
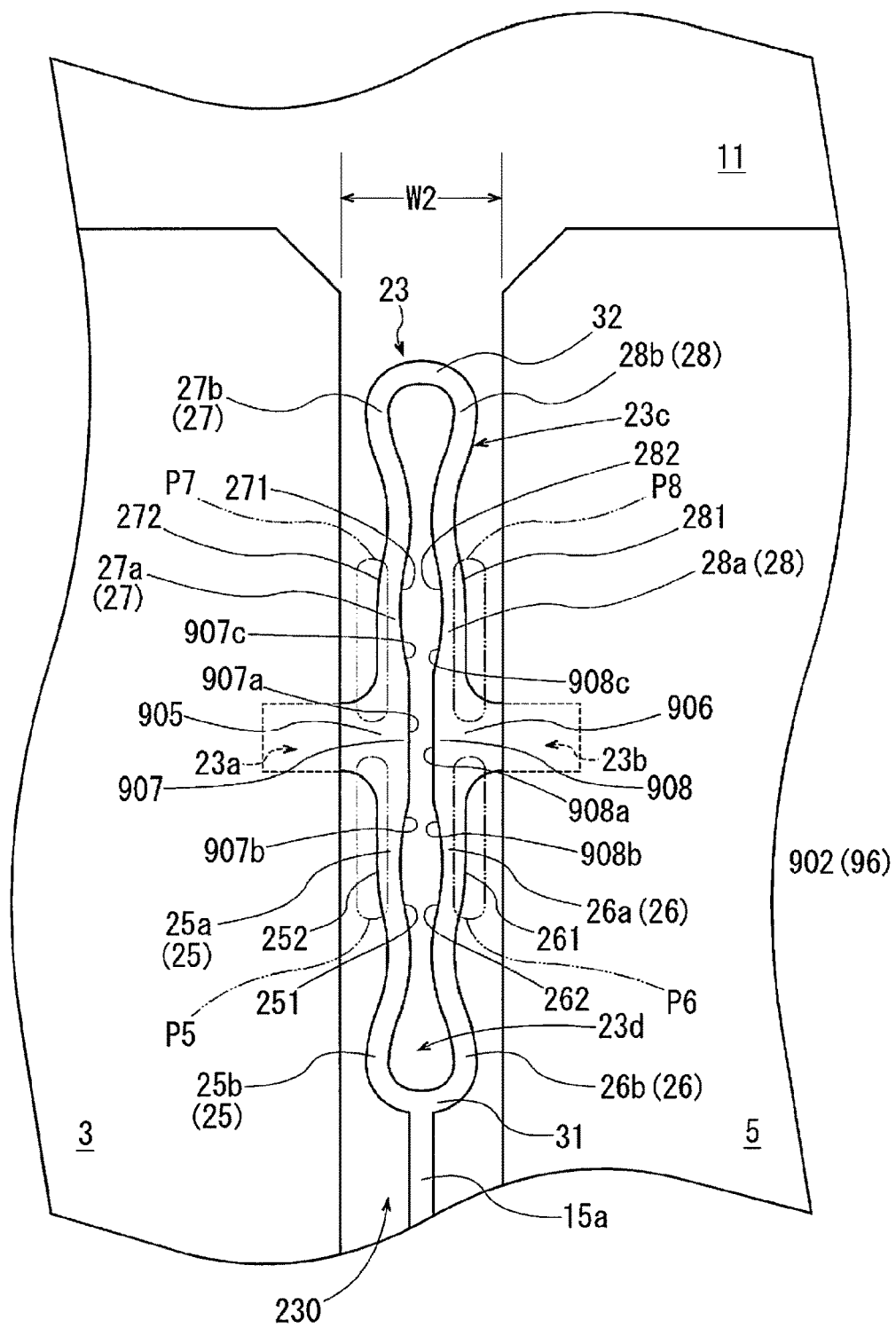
FIG. 14 is an enlarged top view showing a region Y2 of FIG. 11 when the solar panel of FIG. 11 is contracted.
Figure 15:
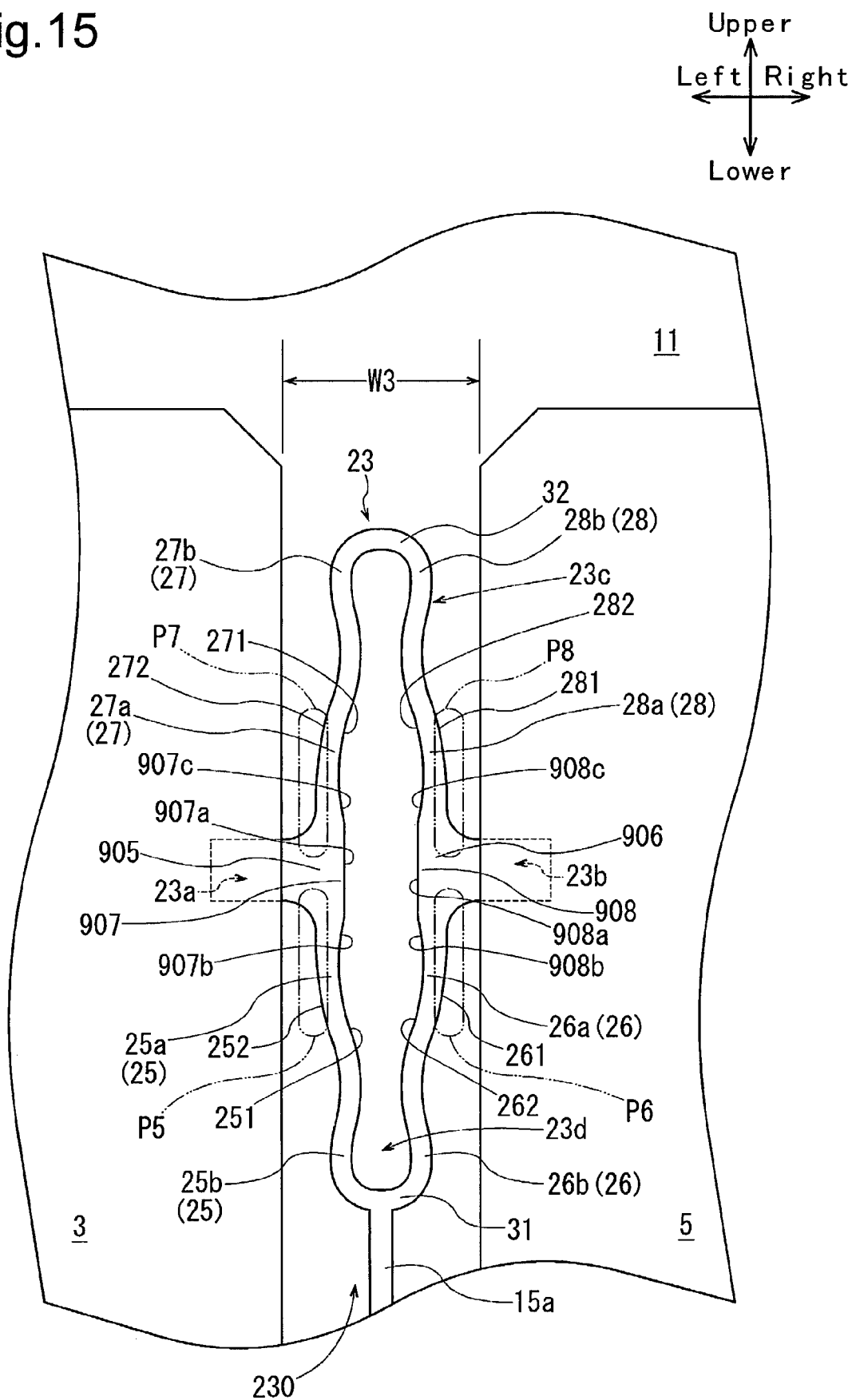
FIG. 15 is an enlarged top view showing the region Y2 of FIG. 11 when the solar panel of FIG. 11 is expanded.

As shown in FIGS. 14 and 15, when the solar panel contracts or expands because of changes in temperature and the distance between the first photovoltaic cell 3 and the second photovoltaic cell 5 changes from the interval W1 shown in FIG. 11 to the interval W2 shown in FIG. 14 or the interval W3 shown in FIG. 15, the connection body 23*c* of each interconnector 23 deforms in the sideward direction. In the same manner as the interconnectors 9, in the interconnectors 23 of the solar panel, when the solar panel contracts or expands, the rear first and second detours 25 and 26 and the front first and second detours 27 and 28 are deformed so that the first electrode 23*a* and the second electrode 23*b* move closer to or away from each other in the sideward direction while buffering the compression or tension load applied by the first photovoltaic cells 3 and the second photovoltaic cells 5 in the sideward direction.

In each interconnector 23, when the connection body 23*c* deforms as described above, stress is generated in the connection body 23*c* in regions P5 to P8 indicated by imaginary lines. In the same manner as the interconnector 9, in the interconnector 23, the first reinforcement portion 907 reinforces the portion connecting the rear first detour 25, the front first detour 27, and the first junction 905 from a side opposite to the regions P5 and P7. In the same manner, the second reinforcement portion 908 reinforces the portion connecting the rear second detour 26, the front second detour 28, and the second junction 906 from a side opposite to the regions P6 and P8. Thus, in the solar panel, even when stress is generated in the regions P5 to P8 of the interconnector 23, the first reinforcement portion 907 and the second reinforcement portion 908 limit breakage of the connection body 23c.

In the interconnector 23, the rear first detour 25 is curved extending rearward from the first junction 905, and the rear second detour 26 is curved extending rearward from the second junction 906. In the same manner, the front first and second detours 27 and 28 are curved extending frontward from the first and second junctions 905 and 906, respectively. Thus, the interconnector 23 appropriately disperses stress generated by the deformation of the connection body 23c in the regions P5 to P8.

The first joint 31 is connected to the rear first away part 25b and the rear side second away part 26b. The second joint 32 is connected to the front first away part 27b and the front second away part 28b. The rear first away part 25b and the rear side second away part 26b are curved away from each other in the sideward direction. The front first away part 27b and the front second away part 28b are curved away from each other in the sideward direction. The first joint 31 is largely curved and connected to the rear first away part 25b and the rear side second away part 26b. The second joint 32 is largely curved and connected to the front first away part 27b and the front second away part 28b. Thus, in the interconnector 23, when the rear first and second detours 25 and 26 and the front first and second detours 27 and 28 deform, stress generated in the first and second joints 31 and 32 easily and appropriately disperses. In this solar panel, breakage of the first and second joints 31 and 32 of the interconnectors 23 is limited. The other operation of the solar panel is the same as that of the solar panel of the first embodiment.

Third Embodiment

Figure 16:
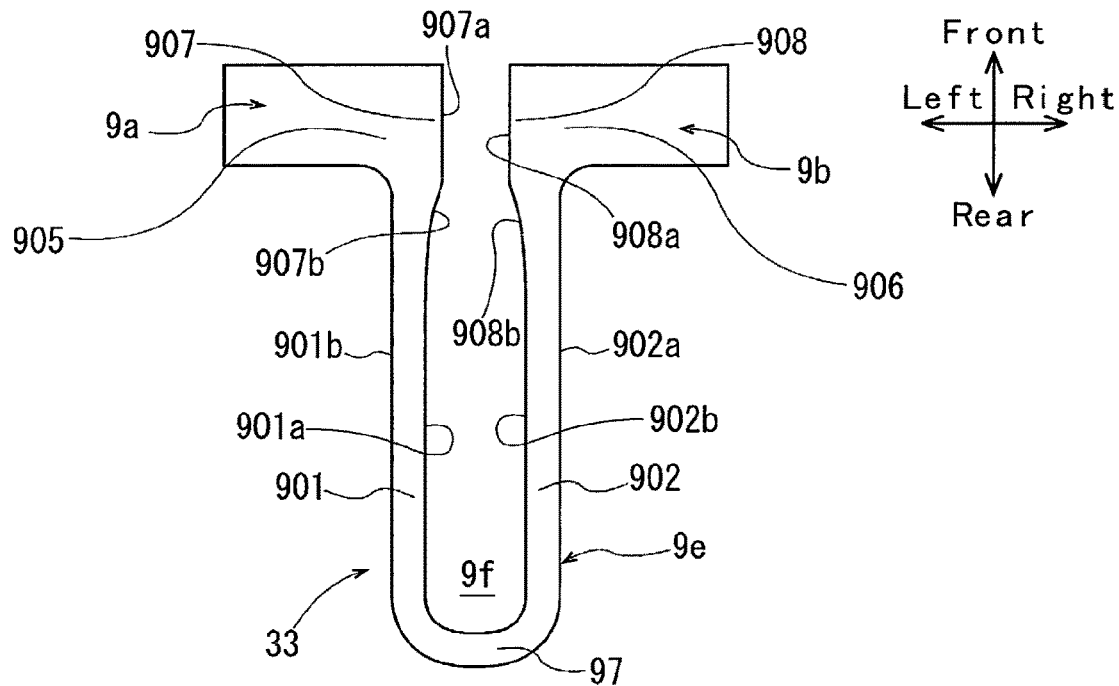
FIG. 16 is an enlarged top view showing an interconnector in a third embodiment of a solar panel.

A third embodiment of a solar panel includes an interconnector 33, which is shown in FIG. 16, instead of the interconnector group 90 of the solar panel of the first embodiment. The interconnector 33 is also formed by stamping a copper plate and includes the first electrode 9a, the second electrode 9b, and a connection body 9e.

The connection body 9e includes the rear first and second detours 901 and 902, the first and second junctions 905 and 906, and the first and second reinforcement portions 907 and 908 of the interconnector 9 and a joint 97. The first reinforcement portion 907 does not include the front first connection edge 907c, and the second reinforcement portion 908 does not include the front second connection edge 908c, which differ from the interconnectors 9.

In the interconnector 33, the first electrode 9a and the second electrode 9b are connected by the connection body 9e. The interconnector 33 has a central portion including a void 9f. The void 9f spaces apart the group of the rear first detour 901, the first junction 905, the first electrode 9a, and the first reinforcement portion 907 from the group of the rear second detour 902, the second junction 906, the second electrode 9b, and the second reinforcement portion 908 in the sideward direction. The other components of the solar panel are the same as those of the solar panel of the first embodiment.

Fourth Embodiment

Figure 17:
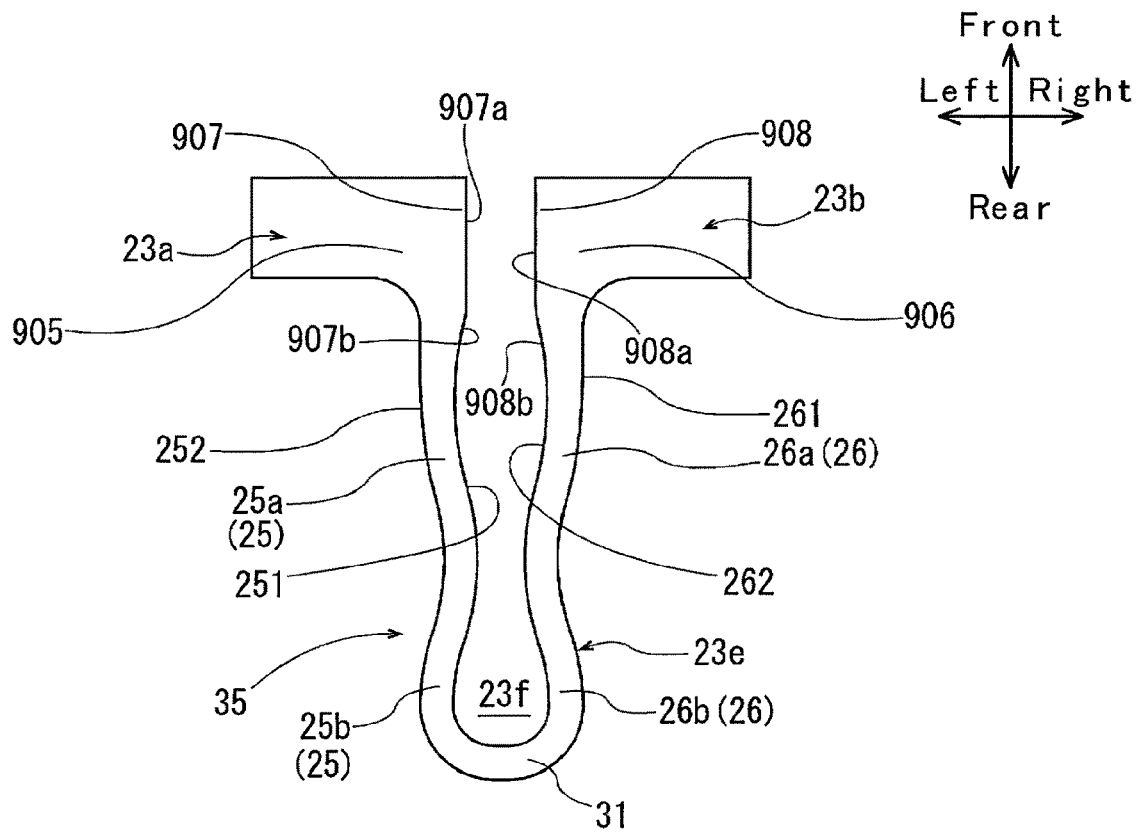
FIG. 17 is an enlarged top view showing an interconnector in a fourth embodiment of a solar panel.

A fourth embodiment of a solar panel includes an interconnector 35, which is shown in FIG. 17, instead of the interconnector group 90 of the solar panel of the first embodiment. The interconnector 35 is also formed by stamping a copper plate and includes the first electrode 23a, the second electrode 23b, and a connection body 23e.

The connection body 23e includes the rear first and second detours 25 and 26, the first and second junctions 905 and 906, and the first and second reinforcement portions 907 and 908 of the interconnector 23 and a joint 31. In the interconnector 35, the first reinforcement portion 907 does not include the front first connection edge 907c, and the second reinforcement portion 908 does not include the front second connection edge 908c.

In the interconnector 35, the first electrode 23a and the second electrode 23b are connected by the connection body 23e. The interconnector 35 includes a central portion having a void 23f. The void 23f spaces apart the group of the rear first detour 25, the first junction 905, the first electrode 23a, and the first reinforcement portion 907 from the group of the rear second detour 26, the second junction 906, the second electrode 23b, and the second reinforcement portion 908 in the sideward direction. The other components of the solar panel are the same as those of the solar panel of the first embodiment.

The interconnectors 33 and 35 have the same operation as the interconnectors 9 and 23. In the interconnector 33, the connection body 9e includes the rear first and second detours 901 and 902, the first and second junctions 905 and 906, the first and second reinforcement portions 907 and 908, and the joint 97. Thus, the interconnector 33 is formed more easily than the interconnectors 9, ultimately, the interconnector group 90. The same applies to the interconnector 35.

The present invention has been described above with the first to fourth embodiments. However, the present invention is not limited to the first to fourth embodiments. The embodiments may be modified and applied without departing from the scope of the invention.

For example, in the solar panel of the first embodiment, the three interconnectors 9 are connected by the first and second links 15a and 15b to form the interconnector group 90. Instead, the three interconnectors 9 may be independent from each other. The same applies to the interconnectors 23 of the solar panel of the second embodiment. In the solar panels of the third and fourth embodiments, a plurality of interconnectors 33 and 35 may be connected by the first and second links 15a and 15b to form interconnector groups.

In the solar panel of the first embodiment, the rear first detour 901 of each interconnector 9 may include the rear first away part 25b of the interconnector 23. Also, the rear second detour 902 and the front first and second detours 903 and 904 may include the rear side second away part 26b and the front first and second away parts 27b and 28b, respectively. The same applies to the interconnector 33 of the solar panel of the third embodiment.

In the solar panel of the second embodiment, the rear first and second detours 25 and 26 and the front first and second detours 27 and 28 of each interconnector 23 may only include the rear first and second curved parts 25a and 26a and the front first and second curved parts 27a and 28a, respectively. The same applies to the interconnector 35 of the solar panel of the fourth embodiment.

The upper surface 3a of each first photovoltaic cell 3 may adhere to the lower surface 1b of the protection plate 1 with the first silicon resin 17a, and the upper surface 5a of each second photovoltaic cell 5 may adhere to the lower surface 1b of the protection plate 1 with the second silicon resin 17b. In this case, it is preferred that the first and second silicon resins 17a and 17b be transparent to limit decreases in the power generation efficiency.

The solar panel of each of the first to fourth embodiments is not limited to flat panels and may be curved.

The present invention is applicable to a solar panel used in various types of solar photovoltaic system in addition to a solar panel installed on the roof of a vehicle.

The invention claimed is:

1. An interconnector configured to electrically connect a first photovoltaic cell and a second photovoltaic cell, wherein the first photovoltaic cell and the second photovoltaic cell are adjacent to each other in a first direction, the first photovoltaic cell is located at a first side in the first direction, and the second photovoltaic cell is located at a second side in the first direction, the interconnector comprising:
a first electrode configured to be connected to the first photovoltaic cell;
a second electrode configured to be connected to the second photovoltaic cell; and
a connection body that connects the first electrode and the second electrode, wherein the first electrode extends from the connection body towards the first side in the first direction and the second electrode extends from the connection body towards the second side in the first direction, such that an entirety of the connection body is configured to be between the first photovoltaic cell and the second photovoltaic cell in the first direction, and the connection body includes:
a first junction connected to the first electrode,
a first detour connected to the first junction from a first side in a second direction generally orthogonal to the first direction and extending from the first junction toward the first side in the second direction,
a first reinforcement portion connected to the first junction and the first detour and extending from the first junction and the first detour toward the second side in the first direction,
a second junction connected to the second electrode,
a second detour connected to the second junction from the first side in the second direction and extending from the second junction toward the first side in the second direction,
a second reinforcement portion connected to the second junction and the second detour and extending from the second junction and the second detour toward the first side in the first direction, and
a joint connecting the first detour and the second detour,
wherein the first detour includes a part that is connected to an end boundary of the first junction that faces towards the first side in the second direction, the part of the first detour extending from the first junction towards the first side in the second direction,
the second detour includes a part that is connected to an end boundary of the second junction that faces towards the first side in the second direction, the part of the second detour extending from the second junction towards the first side in the second direction,
the part of the first detour and the part of the second detour are a curved part that includes a first curved part and a second curved part that are connected together and that curve towards the first side in the first direction and the second side in the first direction, respectively,
the first reinforcement portion includes a first edge and a first connection edge connected to the first edge,
the first edge is an edge of the first reinforcement portion furthermost at the second side in the first direction,
the first connection edge extends from the first edge in a manner inclined toward the first side in the first direction and is connected to an edge of the first detour located at the second side in the first direction,
the second reinforcement portion includes a second edge and a second connection edge connected to the second edge,
the second edge is an edge of the second reinforcement portion furthermost at the first side in the first direction,
the second connection edge extends from the second edge in a manner inclined toward the second side in the first direction and is connected to an edge of the second detour located at the first side in the first direction,
the interconnector includes a void that is defined at least, in part, by an entirety of the first edge and the first connection edge of the first reinforcement portion, an entirety of the second edge and the second connection edge of the second reinforcement portion, an entirety of the edge of the first detour, an entirety of the edge of the second detour, and an entirety of an inner edge of the joint,
the first detour includes a first away part, connected to the part of the first detour, extending away from the second detour, and an entirety of the first away part is on the first side in the second direction of the first junction and the part of the first detour,
the second detour includes a second away part, connected to the part of the second detour, extending away from the first detour, and an entirety of the second away part is on the first side in the second direction of the second junction and the part of the second detour, and
the joint is curved and connected to the first away part and the second away part on the first side in the second direction of the first away part and the second away part.

2. The interconnector according to claim 1, wherein
the first detour is one of two first detours,
the two first detours extend from the first junction toward the first side and the second side in the second direction,
the second detour is one of two second detours,
the two second detours extend from the second junction toward the first side and the second side in the second direction,
the joint includes a first joint connecting the first detour and the second detour that extend toward the first side in the second direction, and
the interconnector further comprises a second joint connecting the first detour and the second detour that extend toward the second side in the second direction.

3. The interconnector according to claim 1, wherein the first electrode, the second electrode, and the connection body are formed of a single plate.

4. A solar panel comprising:
the interconnector according to claim 1;
the first photovoltaic cell;
the second photovoltaic cell;
a protection cover including an upper surface and a lower surface, wherein the protection cover is transparent from the upper surface to the lower surface;

a back cover that cooperates with the protection cover to cover the first photovoltaic cell, the second photovoltaic cell, and the interconnector located between the protection cover and the back cover; and an encapsulation member that encapsulates the first photovoltaic cell, the second photovoltaic cell, and the interconnector and fixes the first photovoltaic cell, the second photovoltaic cell, and the interconnector to one another.

5. The solar panel according to claim 4, further comprising:

a first silicon resin adhering the first photovoltaic cell to the back cover; and a second silicon resin adhering the second photovoltaic cell to the back cover.

6. The interconnector according to claim 1, wherein the joint has a semicircle shape that is open towards a second side in the second direction.

7. The interconnector according to claim 1, wherein a first width of the void, between the first edge of the first reinforcement part and the second edge of the second reinforcement part, in the first direction is less than a second width of the void, between the edge of the first detour and the edge of the second detour, in the first direction.

* * * * *